United States Patent
Islam et al.

(10) Patent No.: US 11,610,991 B2
(45) Date of Patent: Mar. 21, 2023

(54) GATE TRENCH POWER SEMICONDUCTOR DEVICES HAVING IMPROVED DEEP SHIELD CONNECTION PATTERNS

(71) Applicant: Wolfspeed, Inc., Durham, NC (US)

(72) Inventors: Naeem Islam, Morrisville, NC (US); Woongsun Kim, Cary, NC (US); Daniel J. Lichtenwalner, Raleigh, NC (US); Sei-Hyung Ryu, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 76 days.

(21) Appl. No.: 17/082,647

(22) Filed: Oct. 28, 2020

(65) Prior Publication Data

US 2022/0130996 A1 Apr. 28, 2022

(51) Int. Cl.
*H01L 29/78* (2006.01)
*H01L 29/66* (2006.01)
*H01L 29/16* (2006.01)

(52) U.S. Cl.
CPC ...... *H01L 29/7813* (2013.01); *H01L 29/1608* (2013.01); *H01L 29/66727* (2013.01); *H01L 29/66734* (2013.01)

(58) Field of Classification Search
CPC .......... H01L 29/7813; H01L 29/1608; H01L 29/66727; H01L 29/66734
USPC ....................................................... 257/77
See application file for complete search history.

(56) References Cited

U.S. PATENT DOCUMENTS

| | | | |
|---|---|---|---|
| 6,621,107 B2 | 9/2003 | Blanchard et al. | |
| 9,887,287 B1* | 2/2018 | Lichtenwalner | .... H01L 29/4236 |
| 2004/0195618 A1* | 10/2004 | Saito | ................... H01L 29/7802 257/E29.066 |
| 2014/0319605 A1* | 10/2014 | Yilmaz | ............... H01L 29/4236 257/330 |

(Continued)

FOREIGN PATENT DOCUMENTS

| | | |
|---|---|---|
| CN | 110036461 A | 7/2019 |
| CN | 110767753 A | 2/2020 |

(Continued)

OTHER PUBLICATIONS

"Notification of Transmittal of the International Search Report and the Written Opinion of the International Searching Authority, or the Declaration for corresponding International Application No. PCT/US2021/056528, dated Jun. 3, 2022 pp. 33)."

*Primary Examiner* — Igwe U Anya
(74) *Attorney, Agent, or Firm* — Myers Bigel, P.A.

(57) ABSTRACT

A power semiconductor device comprises a semiconductor layer structure having a wide band-gap drift region having a first conductivity type, a gate trench having first and second opposed sidewalls that extend in a first direction in an upper portion of the semiconductor layer structure, first and second well regions having a second conductivity type in the upper portion of the semiconductor layer structure, the first well region comprising part of the first sidewall and the second well region comprising part of the second sidewall. A deep shielding region having the second conductivity type is provided underneath the gate trench, and a plurality of deep shielding connection patterns that have the second conductivity type are provided that electrically connect the deep shielding region to the first and second well regions. The deep shielding connection patterns are spaced apart from each other along the first direction.

22 Claims, 18 Drawing Sheets

(56) References Cited

U.S. PATENT DOCUMENTS

| | | |
|---|---|---|
| 2018/0331204 A1 | 11/2018 | Aichinger et al. |
| 2019/0067420 A1 | 2/2019 | Takaya et al. |
| 2019/0131398 A1 | 5/2019 | Kyogoku et al. |
| 2021/0273091 A1 | 9/2021 | Lee |
| 2022/0052152 A1* | 2/2022 | Lichtenwalner .... H01L 29/1608 |

FOREIGN PATENT DOCUMENTS

| | | | |
|---|---|---|---|
| CN | 111403486 A | * | 7/2020 |
| KR | 20220039254 A | | 3/2022 |
| WO | 03010812 A1 | | 2/2003 |
| WO | 2013014943 A2 | | 1/2013 |
| WO | 2018225600 A1 | | 12/2018 |
| WO | 2019159351 A1 | | 8/2019 |

* cited by examiner

GATE TRENCH POWER SEMICONDUCTOR DEVICES HAVING IMPROVED DEEP SHIELD CONNECTION PATTERNS

FIELD OF THE INVENTION

The present invention relates to power semiconductor devices and, more particularly, to power semiconductor devices having gate trenches and to methods of fabricating such devices.

BACKGROUND

A Metal Insulating Semiconductor Field Effect Transistor ("MISFET") is a well-known type of semiconductor transistor that may be used as a switching device. A MISFET is a three terminal device that has gate, drain and source terminals and a semiconductor body. A source region and a drain region are formed in the semiconductor body that are separated by a channel region, and a gate electrode (which may act as the gate terminal or be electrically connected to the gate terminal) is disposed adjacent the channel region. A MISFET may be turned on or off by applying a bias voltage to the gate electrode. When a MISFET is turned on (i.e., it is in its "on-state"), current is conducted through the channel region of the MISFET between the source region and drain regions. When the bias voltage is removed from the gate electrode (or reduced below a threshold level), the current ceases to conduct through the channel region. An n-type MISFET has n-type source and drain regions and a p-type channel. An n-type MISFET thus has an "n-p-n" design. An n-type MISFET turns on when a gate bias voltage is applied to the gate electrode that is sufficient to create a conductive n-type inversion layer in the p-type channel region that electrically connects the n-type source and drain regions, thereby allowing for majority carrier conduction therebetween. The gate electrode of a power MISFET is typically separated from the channel region by a thin gate dielectric layer. A P-type MISFET has an "p-n-p" design and turns on when a gate bias voltage is applied to the gate electrode that is sufficient to create a conductive p-type inversion layer in the n-type channel region that electrically connects the p-type source and drain regions.

In some applications, MISFETs may need to carry large currents and/or be capable of blocking high voltages. Such MISFETs are often referred to as "power" MISFETs. Power MISFETs are often fabricated from wide band-gap semiconductor materials, such as silicon carbide ("SiC") or gallium nitride ("GaN") based semiconductor materials. Herein, a wide band-gap semiconductor material refers to a semiconductor material having a band-gap greater than 1.40 eV. Typically, power MISFETs implement the thin gate dielectric layer using an oxide layer such as a silicon oxide layer. A power MISFET that includes an oxide gate dielectric layer is referred to as a Metal Oxide Semiconductor Field Effect Transistor ("MOSFET").

Power semiconductor devices can have a lateral structure or a vertical structure. In a device having a lateral structure, the terminals of the device (e.g., the drain, gate and source terminals for a power MOSFET device) are on the same major surface (i.e., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate such as a growth substrate. Herein, the term "semiconductor layer structure" refers to a structure that includes one or more semiconductor layers, such as semiconductor substrates and/or semiconductor epitaxial layers.

A conventional power semiconductor device typically has a semiconductor substrate, such as a silicon carbide substrate having a first conductivity type (e.g., an n-type substrate), on which an epitaxial layer structure having the first conductivity type (e.g., n-type) is formed. A portion of this epitaxial layer structure (which may comprise one or more separate layers) functions as a drift region of the power semiconductor device. The device typically includes an "active region," which includes one or more power semiconductor devices that have a junction such as a p-n junction. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices. The power semiconductor devices may have a unit cell structure in which the active region of each power semiconductor device includes a plurality of individual "unit cell" devices that are electrically connected in parallel and that together function as a single power semiconductor device.

Vertical power semiconductor devices that include a MOSFET transistor can have a standard gate electrode design in which the gate electrode of the transistor is formed on top of the semiconductor layer structure or, alternatively, may have the gate electrode buried in a trench within the semiconductor layer structure. MOSFETs having buried gate electrodes are typically referred to as gate trench MOSFETs. With the standard gate electrode design, the channel region of each unit cell transistor is horizontally disposed underneath the gate electrode. In contrast, in the gate trench MOSFET design, the channel is vertically disposed. Gate trench MOSFETs may provide enhanced performance, but typically require a more complicated manufacturing process.

SUMMARY

Pursuant to some embodiments of the present invention, power semiconductor devices are provided that include a semiconductor layer structure comprising a drift region that comprises a wide band-gap semiconductor material, the drift region having a first conductivity type, a gate trench in an upper portion of the semiconductor layer structure, the gate trench having a longitudinal axis that extends in a first direction and comprising first and second opposed sidewalls that each extend parallel to the longitudinal axis, first and second well regions having a second conductivity type that is different from the first conductivity type in the upper portion of the semiconductor layer structure above the drift region, the first well region comprising part of the first sidewall and the second well region comprising part of the second sidewall, a deep shielding region having the second conductivity type in the semiconductor layer structure underneath the gate trench, and a plurality of deep shielding connection patterns that have the second conductivity type in the upper portion of the semiconductor layer structure, the deep shielding connection patterns spaced apart from each other along the first direction, each deep shielding connection pattern extending in a second direction that is different from the first direction, each deep shielding connection pattern establishing part of the first sidewall of the gate trench and establishing part of the second sidewall of the gate trench. The deep shielding connection patterns electrically connect the deep shielding region to the first and second well regions.

In some embodiments, the power semiconductor device further comprises a plurality of semiconductor channel regions that have the second conductivity type in the first and second sidewalls of the gate trench, the semiconductor channel regions positioned between adjacent deep shielding connection patterns.

In some embodiments, the power semiconductor device further comprises first and second source regions having the first conductivity type on top of the respective first and second well regions.

In some embodiments, the deep shielding connection patterns have a higher doping concentration than the first and second well regions. In some embodiments, the deep shielding connection patterns extend to an upper surface of the semiconductor layer structure. In some embodiments, the deep shielding connection patterns sub-divide the first source region into a plurality of spaced apart segments and sub-divide the second source region into a plurality of spaced apart segments. In some embodiments, portions of the deep shielding region that are aligned along the second direction with the respective deep shielding connection patterns have higher doping concentrations of second conductivity type dopants than do the remainder of the deep shielding region.

In some embodiments, the power semiconductor device further comprises a gate insulation layer in the gate trench that covers a bottom surface and the first and second sidewalls of the gate trench, a gate electrode in the gate trench on the gate insulation layer, a first source/drain contact that directly contacts the first source region, the second source region and the deep shielding connection patterns, and a second source/drain contact on a lower surface of the semiconductor layer structure.

In some embodiments, the second direction is substantially perpendicular to the first direction.

In some embodiments, the wide band-gap semiconductor comprises silicon carbide.

In some embodiments, the power semiconductor device further comprises an additional plurality of gate trenches in the upper portion of the semiconductor layer structure, each of the additional plurality of gate trenches comprising respective first and second opposed sidewalls that extend in the first direction and an additional plurality of deep shielding regions having the second conductivity type in the semiconductor layer structure underneath the respective additional plurality of gate trenches. In such embodiments, each deep shielding connection pattern extends continuously in the second direction and is formed in both the first sidewall and the second sidewall of each of the respective additional plurality of gate trenches. The semiconductor device may further include an additional plurality of semiconductor channel regions that have the second conductivity type in the first and second sidewalls of the respective additional plurality of gate trenches, the semiconductor channel regions positioned between adjacent deep shielding connection patterns in each of the additional plurality of gate trenches.

In some embodiments, the first and second source regions completely cover top surfaces of the respective first and second well regions.

Pursuant to further embodiments of the present invention, power semiconductor devices are provided that a semiconductor layer structure comprising a drift region that comprises a wide band-gap semiconductor material having a first conductivity type, a plurality of gate trenches in an upper portion of the semiconductor layer structure, each gate trench having a longitudinal axis that extends in a first direction and comprising first and second opposed sidewalls that each extend in the first direction, a plurality of source trenches in an upper portion of the semiconductor layer structure, each source trench having a longitudinal axis that extends in a second direction that is different from the first direction and comprising first and second opposed sidewalls that each extend in the second direction, and a plurality of deep shielding regions having the second conductivity type in the semiconductor layer structure underneath the respective source trenches.

In some embodiments, a metal source contact extends into the source trenches.

In some embodiments, the power semiconductor device further comprises a plurality of additional deep shielding regions having the second conductivity type in the semiconductor layer structure underneath the respective gate trenches.

In some embodiments, each gate trench comprises a segmented gate trench that comprises a plurality of spaced apart collinear gate trench segments.

In some embodiments, each source trench comprises a segmented source trench that comprises a plurality of spaced apart collinear source trench segments. In some embodiments, each source trench comprises a continuous source trench. In some embodiments, each source trench comprises a segmented source trench that comprises a plurality of spaced apart collinear source trench segments.

In some embodiments, each gate trench comprises a segmented gate trench that comprises a plurality of spaced apart collinear gate trench segments. In some embodiments, each gate trench comprises a continuous gate trench.

In some embodiments, the semiconductor layer structure further comprises a plurality of well regions having a second conductivity type that is different from the first conductivity type, the well regions on an upper surface of the drift region, and wherein the metal source contact electrically connects the deep shielding regions to the well regions.

In some embodiments, the power semiconductor device further comprises a source region having the first conductivity type on an upper surface of the well region.

In some embodiments, the power semiconductor device further comprises a gate electrode in each gate trench and a dielectric pattern that electrically insulates sidewalls of the gate electrodes from the metal source contact.

In some embodiments, the second direction is substantially perpendicular to the first direction.

In some embodiments, the wide band-gap semiconductor comprises silicon carbide.

Pursuant to still further embodiments of the present invention, power semiconductor devices are provided that include a semiconductor layer structure comprising a drift region that comprises a wide band-gap semiconductor material, the drift region having a first conductivity type, a gate trench in an upper portion of the semiconductor layer structure, the gate trench having a longitudinal axis that extends in a first direction and comprising first and second opposed sidewalls that each extend in the first direction, a first gate electrode on the first sidewall of the gate trench, a second gate electrode on the second sidewall of the gate trench, and a source contact in the gate trench between the first and second gate electrodes.

In some embodiments, the power semiconductor device further comprises a first gate dielectric layer between the first sidewall of the gate trench and the first gate electrode and a second gate dielectric layer between the second sidewall of the gate trench and the second gate electrode.

In some embodiments, the power semiconductor device further comprises a deep shielding region having the second conductivity type in the semiconductor layer structure underneath the gate trench.

In some embodiments, a portion of the source contact that is within the gate trench directly contacts the deep shielding region.

In some embodiments, the power semiconductor device further comprises first and second well regions having a second conductivity type that is different from the first conductivity type in the upper portion of the drift region on opposed sides of the gate trench and first and second source regions having the first conductivity type in upper portions of the respective first and second well regions.

In some embodiments, the power semiconductor device further comprises a first inter-metal dielectric layer that is in the gate trench between the first gate electrode and the source contact and a second inter-metal dielectric layer that is in the gate trench between the second gate electrode and the source contact.

In some embodiments, the source contact comprises a metal source contact and is also directly on the first and second source regions.

In some embodiments, the first gate dielectric layer extends between the deep shielding region and the first gate electrode, and the second dielectric layer extends between the deep shielding region and the second gate electrode.

In some embodiments, the first inter-metal dielectric layer directly contacts the first source region and the second inter-metal dielectric layer directly contacts the second source region.

In some embodiments, the first and second inter-metal dielectric layers directly contact the deep shielding region.

In some embodiments, the source contact comprises a continuous source contact that extends between the first and second gate electrodes for substantially a length of the gate trench.

In some embodiments, the source contact comprises a metal pattern that extends on top of the semiconductor layer structure that comprises a plurality of spaced apart downwardly extending plugs that extend into the gate trench.

Pursuant to additional embodiments of the present invention, methods of fabricating a semiconductor device are provided in which a semiconductor layer structure comprising a wide band-gap semiconductor material is provided, the semiconductor layer structure comprising a drift region having a first conductivity type and a well layer having a second conductivity type that is different from the first conductivity type, the well layer on an upper surface of the drift region. A gate trench is formed in an upper portion of the semiconductor layer structure, the gate trench having a longitudinal axis that extends in a first direction and comprising first and second opposed sidewalls that extend parallel to the longitudinal axis, the gate trench dividing the well layer into at least first and second well regions. A deep shielding region having the second conductivity type is provided in the semiconductor layer structure underneath the gate trench. A plurality of spaced-apart deep shielding connection patterns that have the second conductivity type are formed in the well region and in the upper portion of the drift region, each deep shielding connection pattern extending in a second direction that is different from the first direction, and each deep shielding connection pattern forming part of the first sidewall of the gate trench and forming part of the second sidewall of the gate trench. The deep shielding connection pattern electrically connects the deep shielding region to the first and second well regions.

In some embodiments, the method further comprises forming a source layer having the first conductivity type on top of the well layer, wherein forming the gate trench divides the source layer into at least first and second source regions.

In some embodiments, the deep shielding connection patterns are formed prior to formation of the source region. In some embodiments, the deep shielding connection patterns divide each of the first and second source regions into a plurality of spaced-apart sub-regions that are separated from one another by the deep shielding connection patterns. In some embodiments, the deep shielding connection patterns are formed prior to formation of the gate trench. In some embodiments, the deep shielding connection patterns are formed after formation of the first and second source regions.

In some embodiments, the method further comprises forming a mask on the source region and within the gate trench and forming a plurality of spaced-apart openings in the mask, each opening extending in the second direction and exposing a respective portion of the top surface of the first source region, a respective portion of the top surface of the second source region, respective portions of the first and second sidewalls of each of the gate trenches, and a respective portion of the top surface of each deep shielding region.

In some embodiments, forming the plurality of spaced-apart deep shielding connection patterns comprises, after forming the openings in the mask, implanting second conductivity dopants into the exposed portions of the first and second sidewalls of each of the gate trenches and into the exposed portions of the top surfaces of the deep shielding regions.

In some embodiments, the second conductivity dopants are implanted into the exposed portions of the first and second sidewalls of each of the gate trenches via first and second angled ion implantation steps.

In some embodiments, the first and second angled ion implantation steps are performed at ion implantation energies of less than 300 kV.

In some embodiments, the second conductivity dopants are implanted into the exposed portions of the first and second sidewalls of each of the gate trenches via an ion implantation step that is performed perpendicularly to an upper surface of the semiconductor layer structure.

In some embodiments, the ion implantation step is performed at ion an implantation energy of at least 100 kV.

In some embodiments, a plurality of semiconductor channel regions that have the second conductivity type are provided in the first and second sidewalls of each of the gate trenches, the semiconductor channel regions positioned between adjacent deep shielding connection patterns.

In some embodiments, the deep shielding connection patterns extend to an upper surface of the semiconductor layer structure.

In some embodiments, portions of the deep shielding region that are aligned along the second direction with the respective deep shielding connection patterns have higher doping concentrations of second conductivity type dopants than do the remainder of the deep shielding region.

Pursuant to yet additional embodiments of the present invention, methods of fabricating a semiconductor device are provided in which a semiconductor layer structure comprising a wide band-gap semiconductor material is provided, the semiconductor layer structure comprising a drift region having a first conductivity type. A plurality of gate trenches are formed in an upper portion of the semiconductor layer structure, each gate trench having a longitudinal axis that extends in a first direction and comprising first and second opposed sidewalls that extend in the first direction. A plurality of source trenches are formed in an upper portion of the semiconductor layer structure, each source trench having a longitudinal axis that extends in a second direction that is different from the first direction and comprising first and second opposed sidewalls that extend in the second direction. A plurality of deep shielding regions having a second conductivity type that is different from the first conductivity type are formed in the semiconductor layer structure underneath at least some of the source trenches.

In some embodiments, the method further comprises forming a source contact that comprises protrusions that extend into respective ones of the source trenches.

In some embodiments, the method further comprises forming a respective gate electrode in each of the gate trenches.

In some embodiments, the protrusions directly contact the deep shielding regions.

In some embodiments, each gate electrode comprises a plurality of spaced-apart gate electrode segments.

In some embodiments, respective ones of the protrusions of the source contact extend continuously in each of the source trenches, and wherein each of the protrusions of the source contact extends between a respective pair of gate electrode segments of each gate electrode.

In some embodiments, each of the protrusions comprises a plurality of spaced-apart segments.

In some embodiments, the method further comprises forming additional deep shielding regions having the second conductivity type in the semiconductor layer structure underneath at least some of the gate trenches.

In some embodiments, the second direction is substantially perpendicular to the first direction.

Pursuant to still further embodiments of the present invention, methods of fabricating a semiconductor device are provided in which a semiconductor layer structure comprising a wide band-gap semiconductor material is formed, the semiconductor layer structure comprising a drift region having a first conductivity type. A gate trench is formed in an upper portion of the semiconductor layer structure, the gate trench having a longitudinal axis that extends in a first direction and comprising first and second opposed sidewalls that extend in the first direction. A first gate electrode is formed on the first sidewall of the gate trench. A second gate electrode is formed on the second sidewall of the gate trench. A source contact is formed in the gate trench between the first and second gate electrodes.

In some embodiments, the method further comprises forming a first gate dielectric layer on the first sidewall of the gate trench prior to forming the first gate electrode and forming a second gate dielectric layer on the second sidewall of the gate trench prior to forming the second gate electrode.

In some embodiments, the method further comprises forming a deep shielding region having the second conductivity type in the semiconductor layer structure underneath the gate trench.

In some embodiments, the method further comprises forming first and second well regions having a second conductivity type that is different from the first conductivity type in the upper portion of the semiconductor layer structure on opposed sides of the gate trench and forming first and second source regions having the first conductivity type in upper portions of the respective first and second well regions.

In some embodiments, the method further comprises forming an inter-metal dielectric layer that is in the gate trench between the first and second gate electrodes.

In some embodiments, the source contact penetrates the inter-metal dielectric layer to directly contact the deep shielding region.

In some embodiments, the source contact comprises a metal source contact and is also directly on the first and second source regions.

In some embodiments, the first gate dielectric layer is between the deep shielding region and the first gate electrode, and the second dielectric layer is between the deep shielding region and the second gate electrode.

DETAILED DESCRIPTION

Figure 1A:
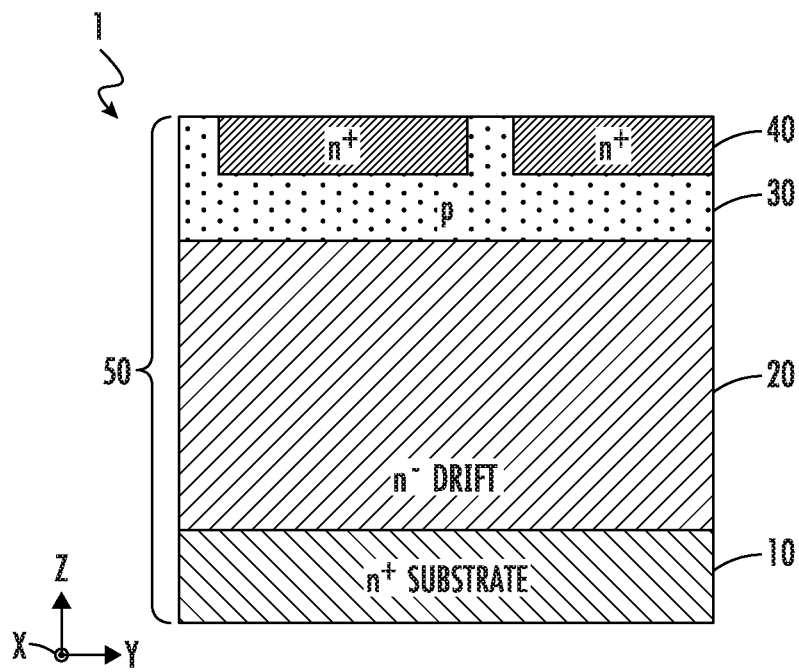
FIGS. 1A-1D are schematic cross-sectional views that illustrate a method of fabricating a conventional gate trench power MOSFET.

Silicon carbide based gate trench vertical power MOSFETs are attractive for many applications due to their inherent lower specific on-resistance, which may result in more efficient operation for power switching operations. Gate trench vertical power MOSFETs exhibit lower specific resistance during on-state operation because the channel is formed in the sidewall of the gate trench. Moreover, the carrier mobility in the sidewall channel of a gate trench MOSFET has been found to be 2-4 times higher than the corresponding carrier mobility in the horizontal channel of a standard (i.e., non-gate trench) vertical power MOSFET. This increased channel mobility results in increased current density during on-state operation allowing for higher switching speeds. Furthermore, the trench design reduces the overall pitch of the device, allowing for increased integration. The lower conduction losses (due to the reduced on-state resistance) and improved switching speeds make gate trench MOSFETs well-suited for high frequency power applications having low to moderate voltage blocking requirements (e.g., 600-1200 Volts). These devices may have reduced requirements for associated passive components, low cost, low weight and require relatively simple cooling schemes.

Gate trench power MOSFETs are susceptible to oxide reliability issues due to the presence of high electric fields in the oxide gate dielectric layer (also referred to herein as a gate oxide layer) that lines the bottom of the gate trench. The high electric fields degrade the gate oxide layer over time, and may eventually result in failure of the device. The highest electric fields occur in corner regions of the gate oxide layer where electric field crowding effects can dramatically increase the levels of the electric field in the gate oxide layer. When gate trench MOSFETs operate in reverse blocking operation, the highest electric field levels occur at the corners of the gate oxide layer at the bottom edges of the gate trench.

So-called "deep shielding regions" are often provided underneath the gate trenches of conventional gate trench power MOSFETs in order to reduce the electric field levels in the gate oxide layer during reverse blocking operation. These deep shielding regions comprise highly doped semiconductor layers having the same conductivity type as the channel region. The deep shielding regions may, for example, extend downwardly 0.5 to 1.0 microns or more from the bottom surface of the gate trench into the drift region of the device. The deep shielding regions may also extend laterally farther than the sidewalls of the trenches and/or may extend along the lower sides of the trenches in some cases. The deep shielding regions are electrically connected to the source terminal of the MOSFET by deep shielding connection patterns. However, reliably implementing deep shielding regions and deep shielding connection patterns may be difficult.

FIGS. 1A-1D are schematic cross-sectional views illustrating a method of fabricating a conventional silicon carbide-based gate trench vertical power MOSFET 1.

As shown in FIG. 1A, the power MOSFET 1 includes a heavily-doped (n+) n-type silicon carbide substrate 10. A lightly-doped (n−) silicon carbide drift region 20 is formed on the substrate 10 by epitaxial growth. A moderately-doped p-type silicon carbide well layer 30 is formed on the upper surface of the n-type drift region 20, either by epitaxial growth or by implanting p-type dopants into the upper portion of the n-type drift region 20. A heavily-doped n+ silicon carbide source pattern 40 is formed in upper portions of the p-type silicon carbide well layer 30 by, for example, ion implantation. The silicon carbide substrate 10, drift region 20, well layer 30 and source pattern 40, along with the various regions/patterns formed therein, comprise a semiconductor layer structure 50 of the power MOSFET 1.

Figure 1B:
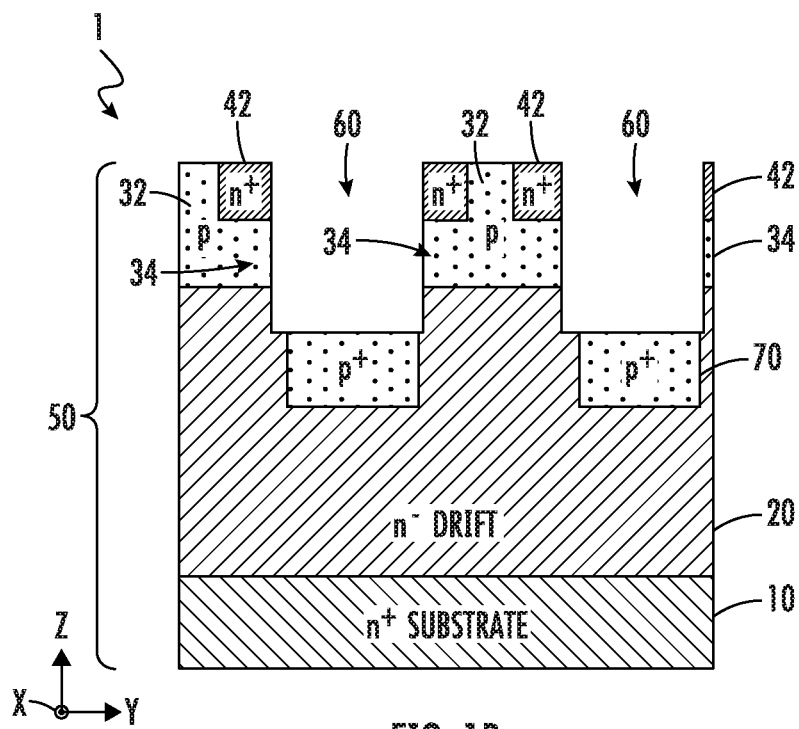

As shown in FIG. 1B, an etching process may be carried out to form a plurality of gate trenches 60 in the upper surface of the semiconductor layer structure 50. Each gate trench 60 may extend laterally (i.e., parallel to a major surface of the semiconductor layer structure) in a first direction across the length (or width) of the power MOSFET 1. In FIGS. 1A-1D, the first direction is into the page and is indicated as being the x-direction. The gate trenches 60 may extend vertically (i.e., perpendicular to a major surface of the semiconductor layer structure or in the z-direction) through the source pattern 40 and well layer 30, and into the drift region 20, as shown, and the gate trenches 60 may be spaced apart from each other in a second direction (here the y-direction that is perpendicular to the first direction. The gate trenches 60 convert the moderately-doped p-type silicon carbide well layer 30 into a plurality of p-wells 32 and convert the heavily-doped n-type silicon carbide source pattern 40 into a plurality of n-type source regions 42. The portions of each p-well 32 that are adjacent the gate trenches 60 act as transistor channels 34, as will be discussed below. Heavily-doped p+ silicon carbide deep shielding regions 70 are formed underneath each gate trench 60 by ion implantation. The silicon carbide deep shielding regions 70 may extend the full length of the respective gate trenches 60.

Figure 1C:
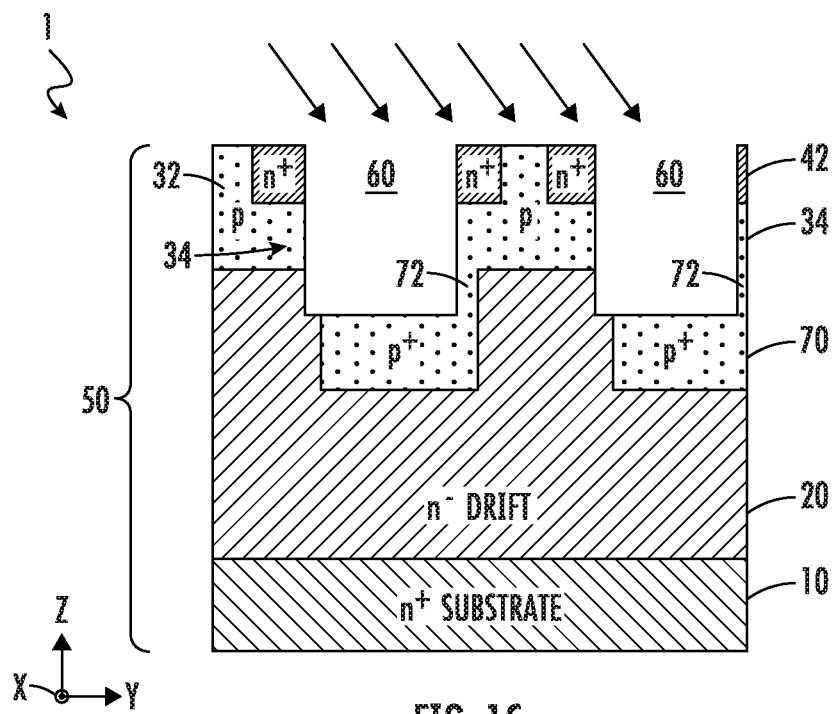

As shown in FIG. 1C, an angled ion implantation may be performed using an implant mask (not shown) to implant p-type dopants into one of the sidewalls (here the right sidewall) of each of the gate trenches 60. As is further shown in FIG. 1C, this ion implantation step converts the lower n-type portion of each right sidewall of the gate trench 60 into heavily-doped p-type deep shielding connection patterns 72. These deep shielding connection patterns 72 electrically connect each deep shielding region 70 to a p-well 32.

Figure 1D:
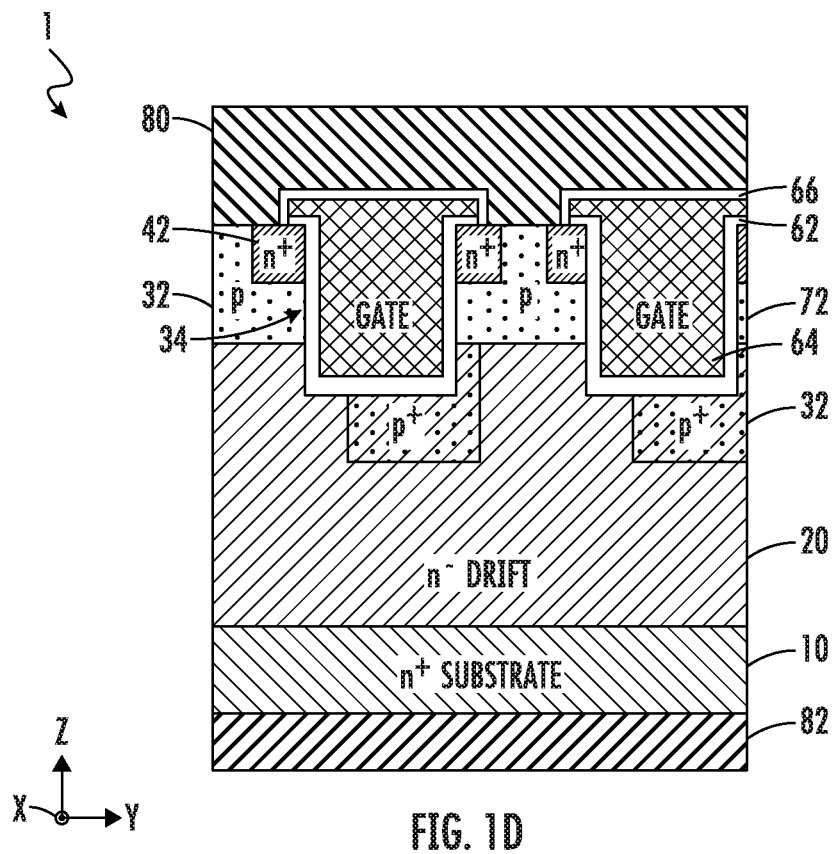

Referring to FIG. 1D, a gate oxide layer 62 is formed on the bottom surface and sidewalls of each gate trench 60. A gate electrode 64 is formed on each gate insulating layer 62 to fill the respective gate trenches 60. An inter-metal dielectric layer 66 is formed on the exposed portions of the gate electrode 64, and a source contact 80 is formed on the upper portion of the device. The source contact 80 is physically and electrically connected to the p-wells 32 and the n-type source regions 42. The source contact 80 may comprise the source terminal of the MOSFET 1 or may be electrically connected to the source terminal. A drain contact 82 is formed on the lower surface of the substrate 10. A gate contact (not shown) is also provided that is connected to the gate electrodes 64 outside the view of the cross-section of FIG. 1D.

The deep shielding region 70 may be effective in protecting the corners of the gate insulating layer 62 from high electric fields during reverse blocking operation. Unfortunately, however, the deep shielding connection patterns 72 that electrically connect the source contact 80 to the deep shielding regions 70 renders the transistor channels 34 on the right sidewall of each gate trench 60 inoperable as there is no n-type semiconductor material on the lower side of the channels 34. Thus, the deep shielding connection patterns 72 provide the necessary electrical connection between the deep shielding regions 70 and the source contact 80, but sacrifice half of the transistor channel area of the MOSFET 1.

Pursuant to embodiments of the present invention, improved techniques are disclosed for forming deep shielding connection patterns that electrically connect the deep shielding regions of a gate trench MISFET to the source contact thereof. The approaches disclosed herein may sacrifice less of the transistor channel area and hence may result in improved device performance. As gate oxide layers are almost always used due to their superior electrical properties, the discussion of embodiments of the present invention below focuses on MOSFETs as opposed to MISFETs. It will be appreciated, however, that the described embodiments may alternatively be implemented with gate dielectric layers formed with materials other than oxides. Any appropriate insulating material may be used (e.g., nitrides, oxy-nitrides, high dielectric constant materials, etc.).

The MOSFETs according to embodiments of the present invention may have gate trenches that extend laterally in a first direction (the x-direction in the figures that follow). In some embodiments, stripes of heavily-doped p-type material may be formed in the MOSFET that extend laterally in a second direction across the gate trenches (the y-direction in the figures that follow). For example, the stripes of heavily-doped p-type material may extend perpendicularly to the gate trenches. These stripes may extend to at least the depth of the p-type deep shielding regions so as to electrically connect the deep shielding regions to the p-wells, and hence to the source contact of the MOSFET. The stripes of heavily-doped p-type material may comprise, for example, perhaps 15% to 25% of the sidewalls of the gate trenches, and hence may only sacrifice about 15% to 25% of the total channel area of the device (as compared to 50% in the conventional MOSFET 1 discussed above).

Pursuant to further embodiments of the present invention, gate trench power MOSFETs are provided that include both gate trenches and source trenches that cross the gate trenches. For example, the source trenches may extend perpendicularly to the gate trenches. Deep shielding regions are formed underneath at least portions of the source trenches, and may also optionally be formed underneath the gate trenches. The source contact may be formed in the source trenches so as to directly contact the deep shielding regions. In some embodiments, the gate electrodes may extend continuously in the respective gate trenches and the portions of the source contact that are in the source trenches may be segmented in order to allow the gate electrodes and the source contact to "cross" in the trenches. In other embodiments, the source contacts may extend continuously in the respective source trenches and the gate electrodes may be segmented.

Pursuant to still further embodiments of the present invention, gate trench power MOSFETs are provided that have source contacts that extend through the gate trenches to directly contact the deep shielding regions. In these embodiments each gate electrode may include first and second gate electrode portions that extend along the two sidewalls of a respective one of the gate trenches, and the source contact may extend through a central portion of the gate trench between the first and second gate electrode portions. An inter-metal dielectric pattern may also be formed in each gate trench that electrically isolates the first and second gate electrode portions from the portion of the source contact that extends through the gate trench. The portions of the source contact that extend into the respective source trenches may be continuous portions that extend the full length of the respective trenches, or may be discrete plugs that extend into the respective trenches at periodic or non-periodic intervals.

The gate trench power MOSFETs according to embodiments of the present invention include reliable deep shielding connection patterns (or equivalent structures) that sacrifice less of the channel area of the MOSFET than do conventional deep shielding connection pattern approaches. Thus, the gate trench power MOSFETs according to embodiments of the present invention may exhibit improved performance.

Embodiments of the present invention will now be described with reference to FIGS. 2A-9. It will be appreciated that features of the different embodiments disclosed herein may be combined in any way to provide many additional embodiments. Thus, it will be appreciated that various features of the present invention are described below with respect to specific examples, but that these features may be added to other embodiments and/or used in place of example features of other embodiments to provide many additional embodiments. Thus, the present invention should be understood to encompass these different combinations. Additionally, while the example embodiments focus on MOSFET implementations, it will be appreciated that the same techniques may be used in other gate trench power semiconductor devices such as insulated gate bipolar transistors (IGBTs), gate controlled thyristors and the like.

Figure 2A:
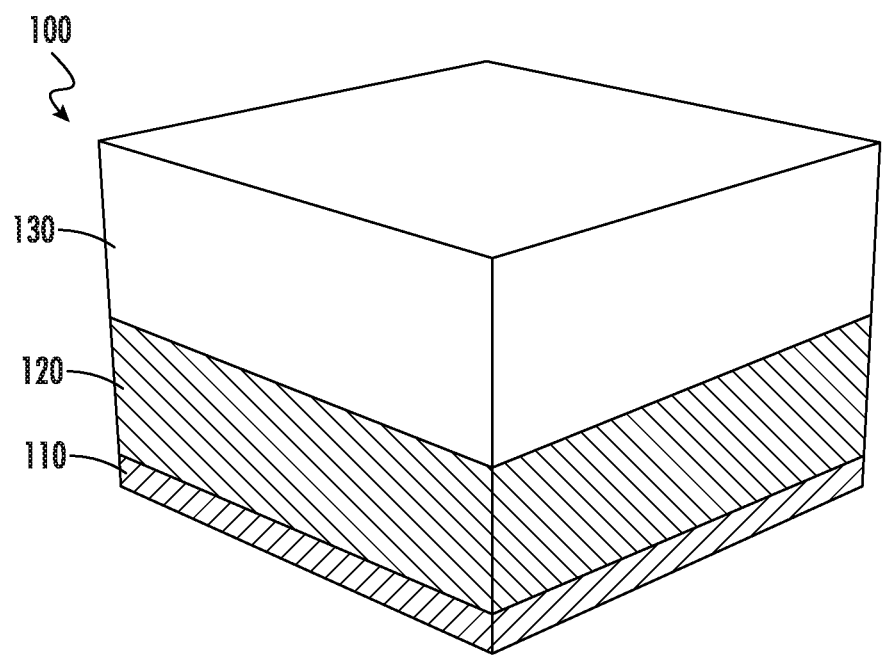
FIGS. 2A-2D are schematic perspective views that illustrate a method of fabricating a semiconductor layer structure of a gate trench power MOSFET according to embodiments of the present invention.
Figure 2B:
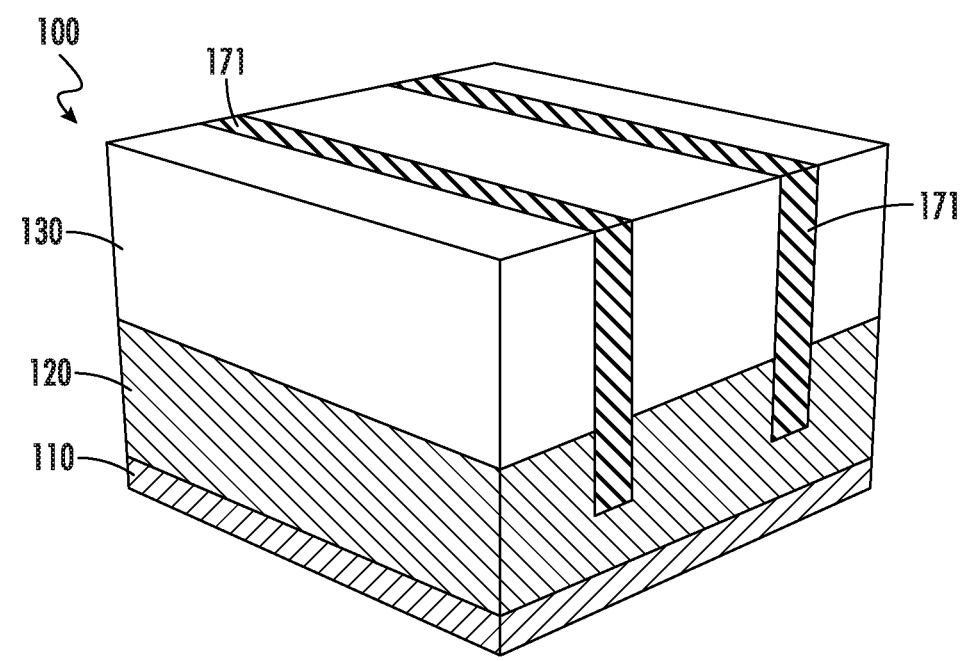
Figure 2C:
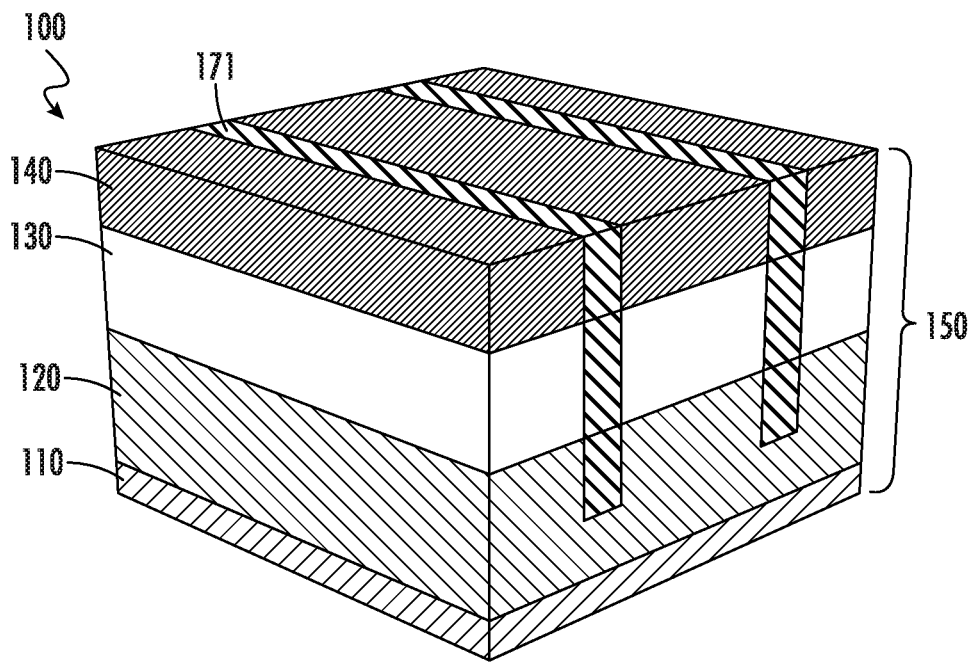
Figure 2D:
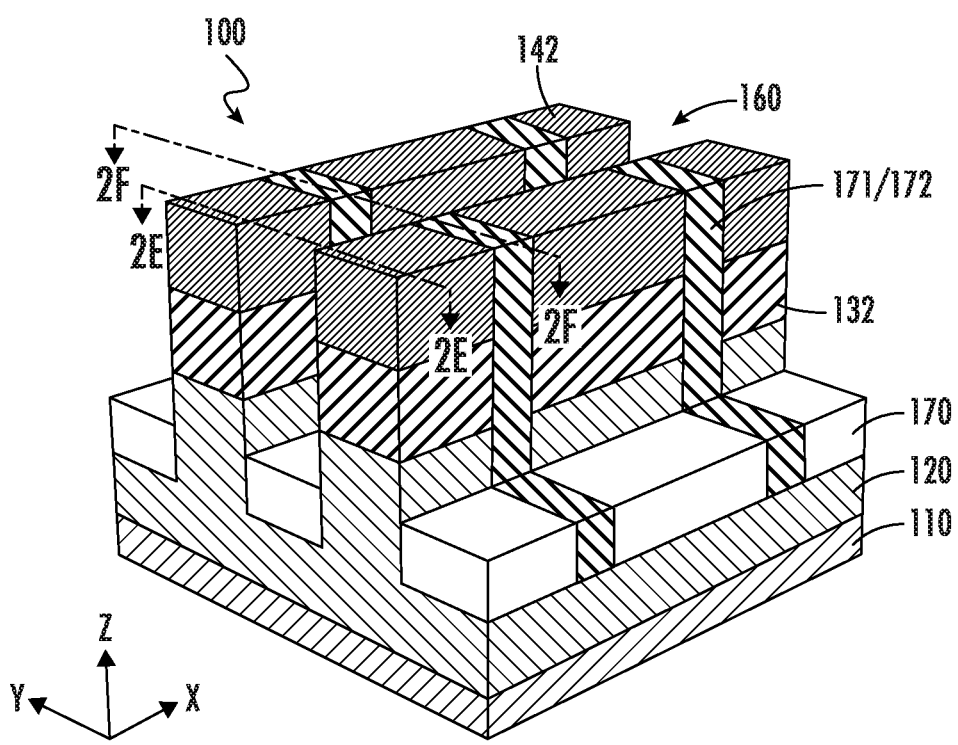
Figure 2E:
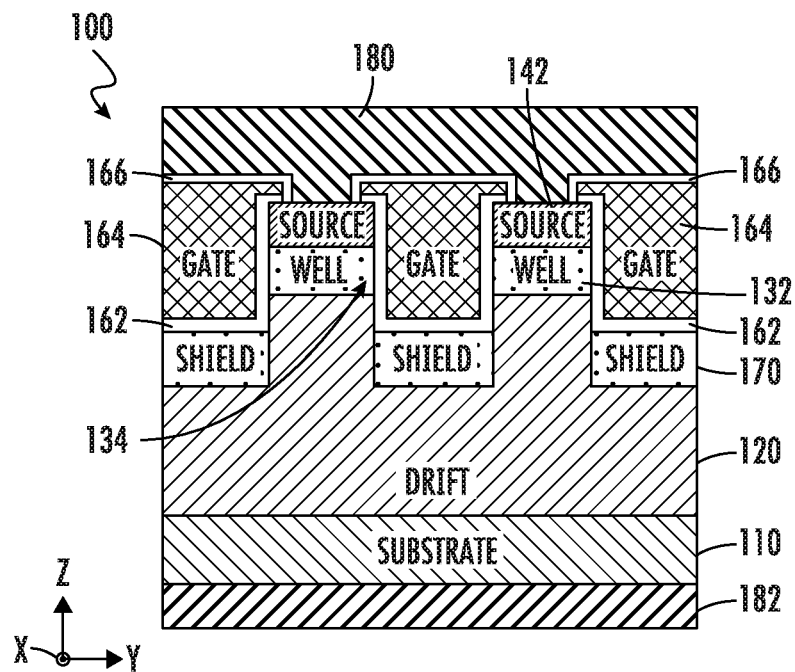
FIGS. 2E and 2F are schematic cross-sectional views taken along lines 2E-2E and 2F-2F of FIG. 2D, respectively, that illustrate cross-sectional views of the gate trench power MOSFET of FIG. 2D after metallization has been formed on the semiconductor layer structure.
Figure 2F:
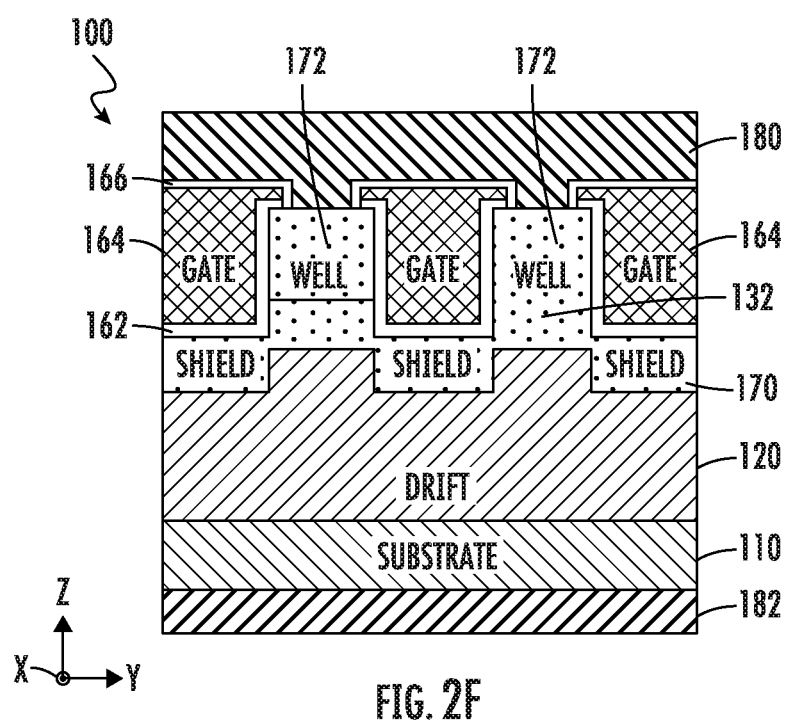

FIGS. 2A-2F are schematic diagrams that illustrate a gate trench power MOSFET 100 according to embodiments of the present invention. More specifically, FIGS. 2A-2D are schematic perspective views that illustrate a method of fabricating the semiconductor layer structure of a gate trench power MOSFET 100, and FIGS. 2E and 2F are schematic cross-sectional views taken along lines 2E-2E and 2F-2F of FIG. 2D, respectively, that illustrate cross-sectional views of the gate trench power MOSFET 100 of FIG. 2D after metallization has been formed on the semiconductor layer structure.

Referring to FIG. 2A, an n-type silicon carbide substrate 110 is provided. The substrate 110 may comprise, for example, a 4H-silicon carbide or a 6H-silicon carbide substrate. In other embodiments, the substrate 110 may be or comprise a different semiconductor material (e.g., a Group III nitride-based material, silicon, gallium arsenide, zinc oxide, etc.) or a non-semiconductor material (e.g., sapphire). The substrate 110 may be heavily-doped with n-type impurities (i.e., an n$^+$ silicon carbide substrate). The impurities may comprise, for example, nitrogen or phosphorous. The doping concentration of the substrate 110 may be, for example, between $1\times10^{18}$ atoms/cm$^3$ and $1\times10^{21}$ atoms/cm$^3$, although other doping concentrations may be used. The substrate 110 may be relatively thick in some embodiments (e.g., 20-100 microns or more). It should be noted that while the substrates are shown in the figures as relatively thin layers, this is done to allow enlargement of other layers and regions of the device, and it will be appreciated that the substrate will typically be much thicker than shown. The thickness of various other layers of the MOSFETs according to embodiments of the present invention likewise may not be shown to scale in order to provide showing enlarged views of various portions of the devices.

A lightly-doped (n$^-$) silicon carbide drift region 120 may be provided on the substrate 110. The n-type drift region 120 may be formed, for example, by epitaxial growth on the substrate 110. The n-type drift region 120 may have, for example, a doping concentration of $1\times10^{16}$ to $5\times10^{17}$ dopants/cm$^3$. The n-type drift region 120 may be a thick region, having a vertical height above the substrate 110 of, for example, 3-50 microns. In some embodiments, an upper portion of the n-type drift region 120 may comprise an n-type current spreading layer (not shown) that is more heavily doped than the lower portion of the n-type drift region 120.

A moderately-doped p-type well layer 130 is formed on the upper surface of the n-type silicon carbide drift region 120. The moderately-doped p-type well layer 130 may be formed, for example, by epitaxial growth or by ion implantation. The moderately-doped p-type well layer 130 may be doped to a desired doping density for the transistor channels of the device. In some embodiments, the moderately-doped p-type well layer 130 may have a doping concentration of, for example, between $1 \times 10^{16}$ atoms/cm$^3$ and $1 \times 10^{19}$ atoms/cm$^3$. The moderately-doped p-type well layer 130 may have a graded doping profile in some embodiments.

Referring to FIG. 2B, an implant mask (not shown) is formed on the structure of FIG. 2A, and striped openings (not shown) are formed in the mask. Then, a high energy, high dosage ion implantation process is used to form stripes 171 of highly doped p-type material through the moderately-doped p-type well layer 130 and into the lightly-doped (n−) silicon carbide drift region 120. The stripes 171 of highly doped p-type material may extend at least as deep as gate trenches that are formed in the structure in a later processing step.

Referring to FIG. 2C, a heavily-doped (n+) n-type silicon carbide source layer 140 is formed in an upper region of the moderately-doped p-type well layer 130 via ion implantation. The stripes 171 of highly doped p-type material may be more heavily doped than the heavily-doped (n+) n-type silicon carbide source layer 140 in some embodiments. For example, the heavily-doped (n+) n-type silicon carbide source layer 140 may have a doping concentration between $1 \times 10^{19}$ atoms/cm$^3$ and $5 \times 10^{21}$ atoms/cm$^3$, with the doping concentration of the p-type stripes 171 being at least 1.2 times higher than the doping concentration of the n-type source layer 140. The above-described layers 110, 120, 130, 140 (and regions formed therein such as the stripes 171 and the p-type deep shielding regions described below) comprise a semiconductor layer structure 150 of MOSFET 100.

Referring to FIG. 2D, a plurality of gate trenches 160 are formed via etching in an upper surface of the semiconductor layer structure 150. Although only one gate trench 160 (and portions of two others) is shown in FIG. 2D, it will be appreciated that a large number of gate trenches 160 are typically provided, where each gate trench 160 extends in a first direction above the substrate 110 (here the gate trenches extend in the x-direction), and the gate trenches 160 are spaced apart from each other in a second direction (here the y-direction) so that the gate trenches 160 extend in length parallel to each other. Each gate trench 160 has a length (corresponding to a distance in the x-direction), a width (corresponding to a distance in the y-direction), and a depth (corresponding to a distance in the z-direction). The length direction is the longest direction, and hence The longitudinal axis of each gate trench 160 refers to an axis that extends in the length direction down the middle of the gate trench 160. Herein, this length direction (the x-direction) may be referred to as a first direction. Each gate trench 160 has first and second opposed sidewalls and a bottom surface that each extend in the first direction and hence extend parallel to the longitudinal axis. The stripes 171 extend in a second direction that is different from the first direction so that the stripes 171 cross the gate trenches 160. In the depicted embodiment, the second direction is perpendicular to the first direction (i.e., the second direction is the width direction/y-direction, although embodiments of the present invention are not limited thereto.

Each gate trench 160 extends through the heavily-doped n-type silicon carbide layer 140 in order to convert this silicon carbide layer into a plurality of spaced apart heavily-doped n-type silicon carbide regions 142 that serve as the source regions of the power MOSFET 100. Each gate trench 160 also extends through the moderately-doped p-type silicon carbide layer 130 in order to convert this layer 130 into a plurality of p-wells 132. Each gate trench 160 also extends into an upper surface of the n-type drift region 120. The sidewalls of each gate trench 160 are the exposed surfaces of the layers/regions of the semiconductor layer structure that are on either side of each gate trench 160. Thus the source regions 142 and the upper portions of the stripes 171 may form/establish the upper portion of each sidewall, the p-wells 132 and middle portions of the stripes 171 may form/establish the middle portion of each sidewall, and the drift region 120 and lower portions of the stripes 171 may form/establish the lower portion of each sidewall.

As is further shown in FIG. 2D, heavily-doped p+ silicon carbide deep shielding regions 170 are formed underneath each gate trench 160 by implanting p-type dopants into the bottom surface of each gate trench 160. The p-type deep shielding regions 170 may be formed via a high energy, high dosage ion implantation step that converts the portions of the lightly-doped n-type drift region that are under the gate trenches 160 into heavily doped p-type regions. The deep shielding regions 170 may extend the full length of the respective gate trenches 160.

As is also shown in FIG. 2D, the stripes 171 of highly doped p-type material extend downwardly beyond the top surface of the deep shielding regions 170, and hence are electrically connected to the deep shielding regions 170. The stripes 171 thus act as deep shielding connection patterns 172 that electrically connect the deep shielding regions 170 to the p-wells 132. Since the stripes 171/deep shielding connection patterns 172 extend to the top surface of the semiconductor layer structure 150, the p-wells 132 need not extend to the top surface of the semiconductor layer structure 150.

Referring to FIGS. 2E and 2F, a conformal gate oxide layer is formed on the bottom surface and sidewalls of each gate trench 160. The conformal gate oxide layer may be formed by oxidizing the exposed silicon carbide via an anneal in an oxygen containing environment. Alternatively, the conformal gate oxide layer may be formed by an oxide deposition step. Portions of the conformal gate oxide layer may be removed to form openings where the source contact 180 can connect to the source regions 140 and the deep shielding connection patterns 172. Removal of these portions of the conformal gate oxide layer leaves a gate oxide layer 162 in each gate trench 160.

A gate electrode 164 is formed on each gate oxide layer 162 to fill the respective gate trenches 160. The gate electrodes 164 may comprise a conductive material such as, for example, polysilicon, a silicate or a metal. An intermetal dielectric layer 166 is formed on the exposed portions of the gate oxide layers 162 and the gate electrodes 164, and a source contact 180 is formed on the upper portion of the device. The source contact 180 may comprise one or more metals and is physically and electrically connected to the deep shielding connection patterns 172 and the n-type source regions 140. The source contact 180 may comprise the source terminal of the MOSFET 100 or may be electrically connected to the source terminal. A drain contact 182 is formed on the lower surface of the substrate 110. A gate contact (not shown) is also provided that is connected to the gate electrodes 164 outside the views of the cross-sections of FIGS. 2E and 2F.

The portions of the sidewalls of the gate trenches where the deep shielding connection patterns 172 (FIG. 2F) are formed are not operable as part of the transistor since they do not include an n-p-n junction structure adjacent a gate electrode. As shown in FIG. 2D, in some embodiments, the extent of the deep shielding connection patterns 172 in the first direction (i.e., in the direction in which the gate trenches 160 extend) may be only about 15%-25% of the extent of the regions of the sidewalls that are between the deep shielding connection patterns 172. As such, only about 15%-25% of the channel region is sacrificed to provide the deep shielding connection patterns 172 that electrically connect the deep shielding regions 170 to the source contact 180, as compared to a sacrifice of 50% of the channel region in the conventional MOSFET 1 of FIGS. 1A-1E. In other embodiments, the extent of the deep shielding connection patterns 172 in the first direction may be between 10%-30%, between 10% and 40%, between 20% and 40% or between 30% and 40% of the extent of the regions of the sidewalls that are between the deep shielding connection patterns 172. All such embodiments may provide improved performance as compared to the MOSFET 100 of FIGS. 1A-1D.

FIGS. 3A-3D are schematic perspective views that illustrate a method of fabricating the semiconductor layer structure of a gate trench power MOSFET 200 according to further embodiments of the present invention. FIGS. 3E and 3F are schematic cross-sectional views taken along lines 3E-3E and 3F-3F of FIG. 3D, respectively, that illustrate cross-sectional views of the gate trench power MOSFET 200 of FIG. 3D after metallization has been formed on the semiconductor layer structure. The MOSFET 200 is similar to the MOSFET 100 described above, but may be fabricated using a low energy implant to form the deep shielding connection patterns thereof.

Figure 3A:
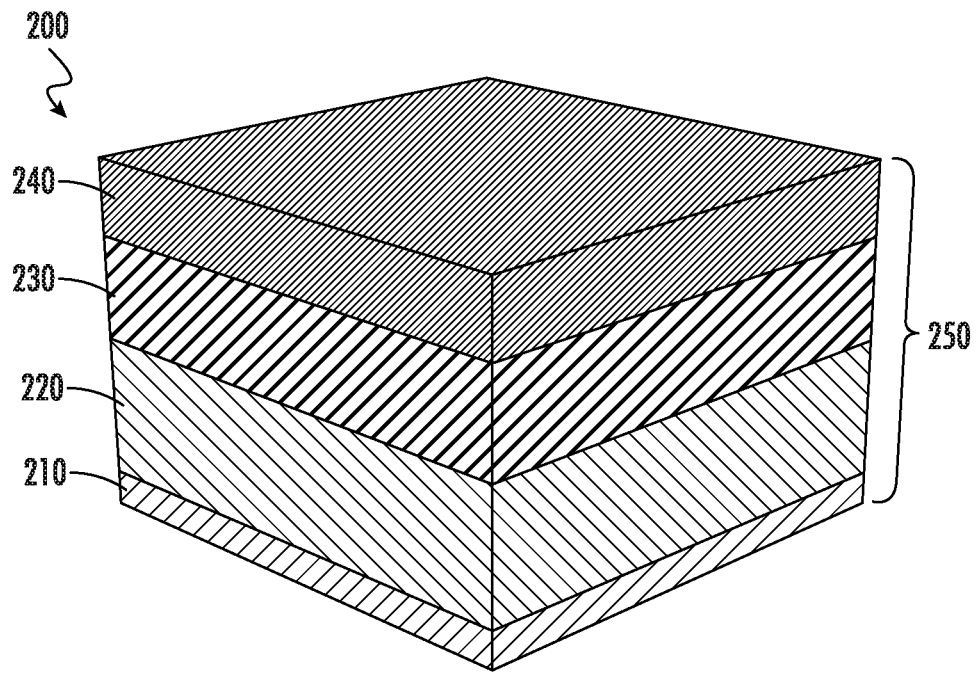
FIGS. 3A-3D are schematic perspective views that illustrate a method of fabricating a semiconductor layer structure of a gate trench power MOSFET according to further embodiments of the present invention.

Referring to FIG. 3A, a heavily-doped ($n^+$) n-type silicon carbide substrate 210 is provided, and a lightly-doped ($n^-$) silicon carbide drift region 220 is formed thereon via epitaxial growth. A moderately-doped p-type well layer 230 is formed on the upper surface of the n-type silicon carbide drift region 220, and a heavily-doped ($n^+$) n-type silicon carbide source layer 240 is formed on the moderately-doped p-type well layer 230. The substrate 210, drift region 220, well layer 230 and source layer 240 comprise a semiconductor layer structure 250. The layers 210, 220, 230, 240 may be formed in the same fashion and have the same characteristics (e.g., thickness, doping densities, etc.) as the corresponding layers of gate trench power MOSFET 100 discussed above, so further description thereof will be omitted.

Figure 3B:
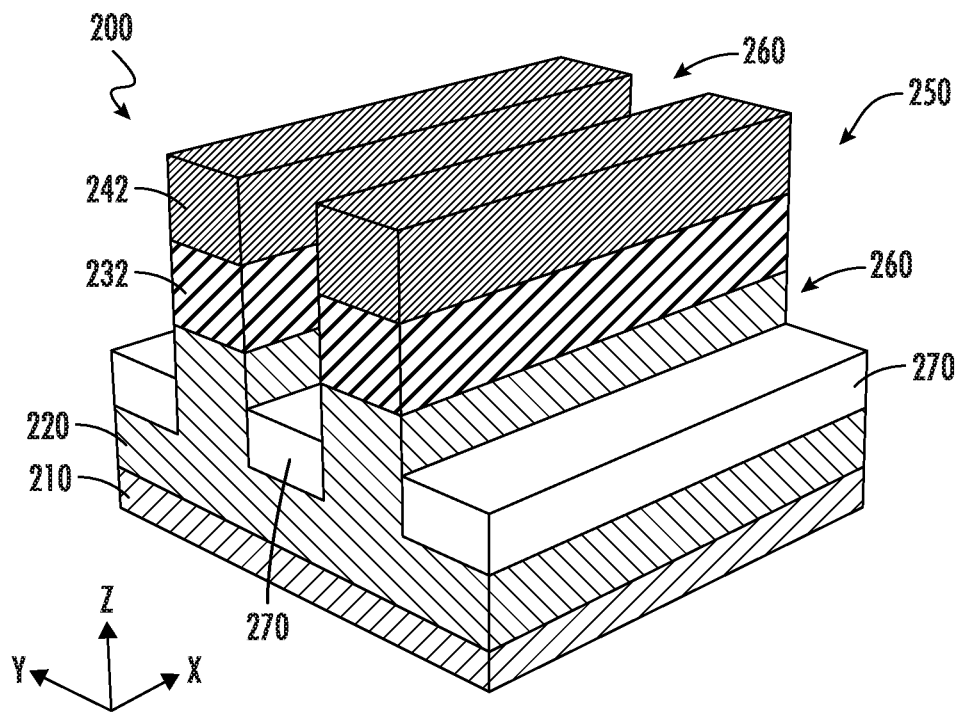

Referring to FIG. 3B, a plurality of gate trenches 260 are formed via etching in an upper surface of the semiconductor layer structure 250. Each gate trench 260 extends in a first direction (the x-direction) above the substrate 210, and the gate trenches 260 are spaced apart from each other in a second direction (the y-direction). Each gate trench 260 extends through the heavily-doped n-type silicon carbide layer 240 in order to convert this silicon carbide layer 240 into a plurality of spaced apart heavily-doped n-type regions 242. Each gate trench 260 also extends through the moderately-doped p-type silicon carbide layer 230 in order to convert this layer 230 into a plurality of p-wells 232. Each gate trench 260 also extends into an upper surface of the n-type drift region 220.

As is further shown in FIG. 3B, heavily-doped $p^+$ silicon carbide deep shielding regions 270 are formed underneath each gate trench 260 by implanting p-type dopants into the bottom surface of each gate trench 260. The p-type shielding patterns 270 may be formed via a high energy, high dosage ion implantation step that converts the portions of the lightly-doped n-type drift region that are under the gate trenches 260 into heavily doped p-type regions. The deep shielding regions 270 may extend the full length of the respective gate trenches 260.

Figure 3C:
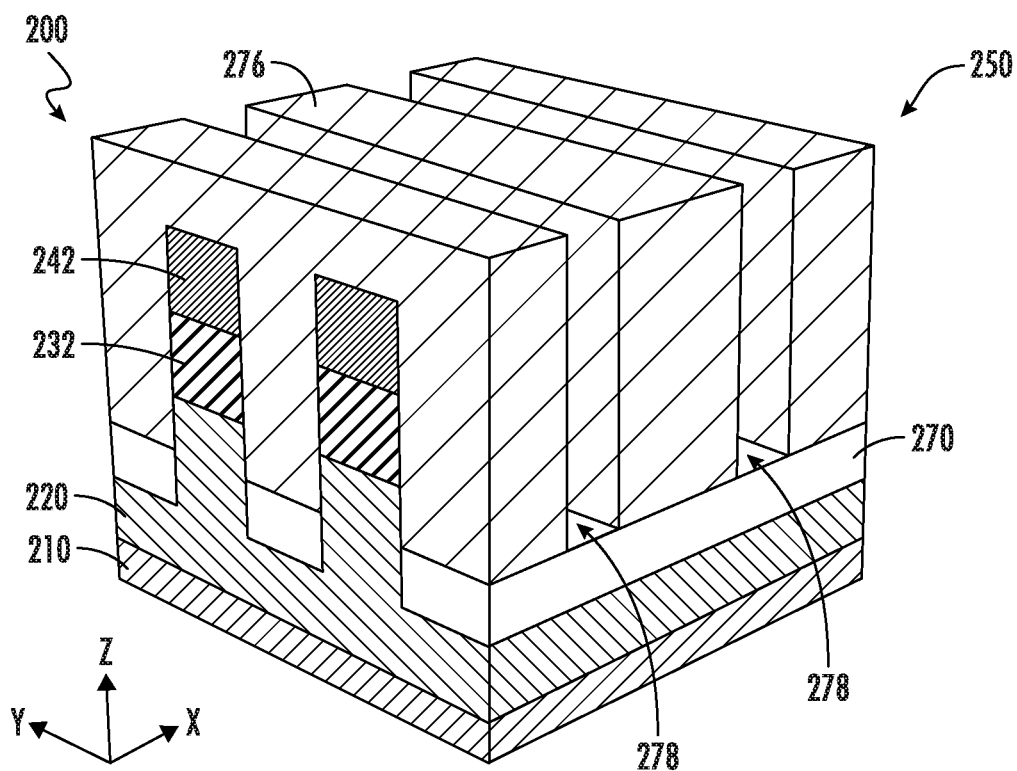

Referring to FIG. 3C, a photoresist implant blocking mask 276 is formed on the structure of FIG. 3B, and the photoresist implant blocking mask 276 is patterned to form a plurality of striped openings 278 therein. A pair of lower energy, high dosage angled ion implants are performed in order to implant the opposed sidewalls of the gate trenches 260 that are exposed via the plurality of striped openings 278. The mask 276 may then be removed. Each lower energy, high dosage angled ion implants may be performed, for example, at an implant energy of between 10 kV and 300 kV with a dosage of between $1\times10^{13}$ and $1\times10^{15}$. In other example embodiments, the implant energy may be between 10 kV and 200 kV, between 10 kV and 100 kV or between 50 kV and 100 kV in each case with a dosage of between $1\times10^{13}$ and $1\times10^{15}$.

Figure 3D:
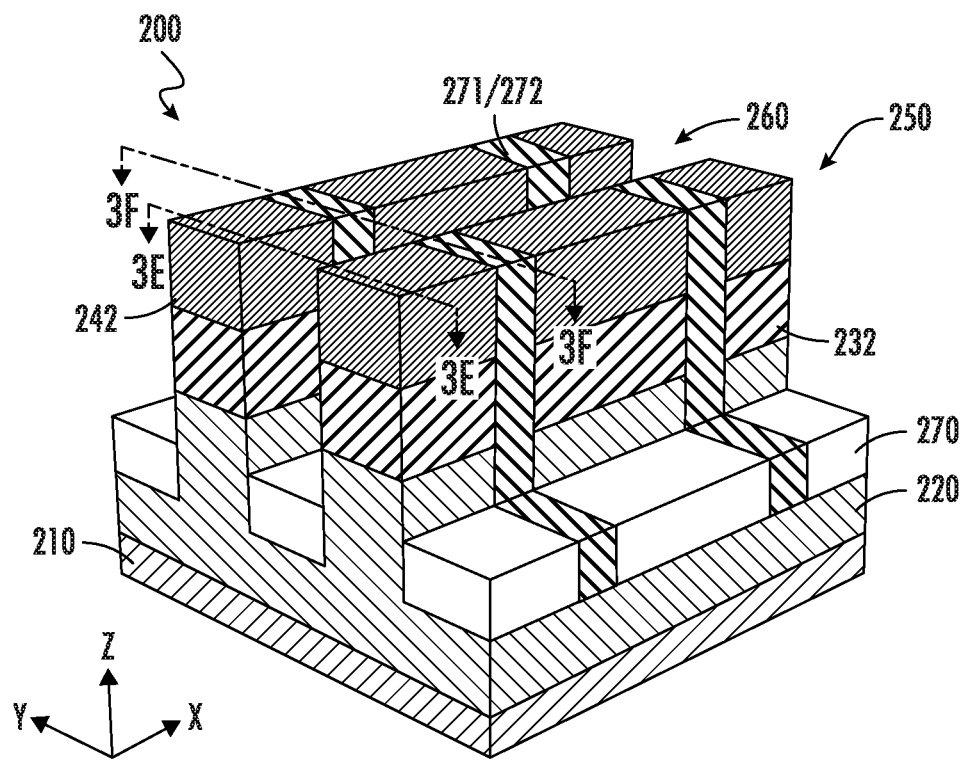
Figure 3E:
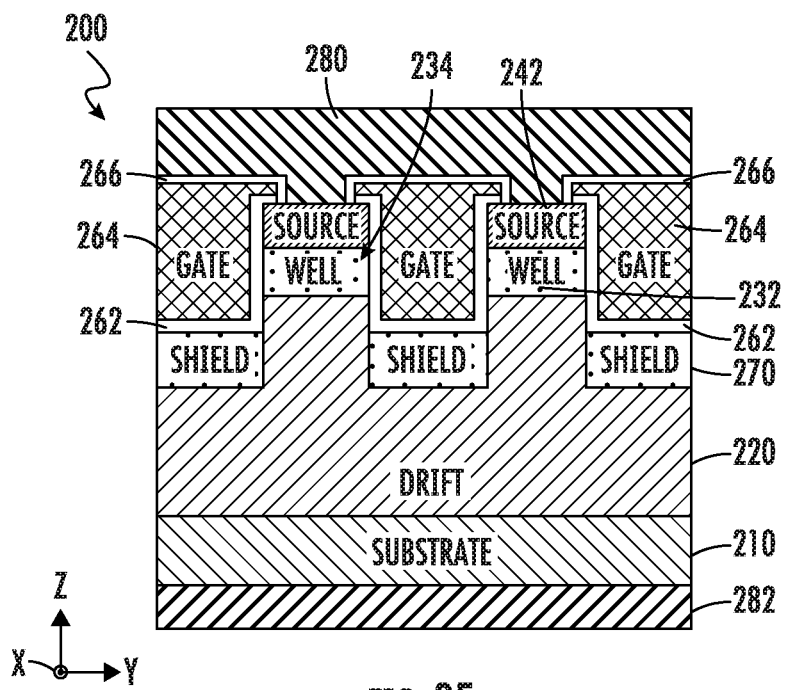
FIGS. 3E and 3F are schematic cross-sectional views taken along lines 3E-3E and 3F-3F of FIG. 3D, respectively, that illustrate cross-sectional views of the gate trench power MOSFET of FIG. 3D after metallization has been formed on the semiconductor layer structure.
Figure 3F:
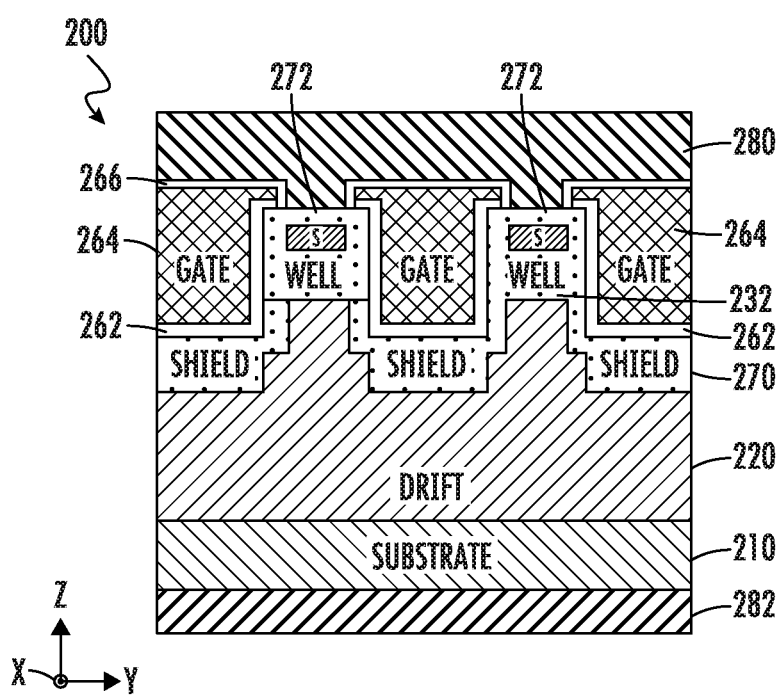

Referring to FIG. 3D, the angled ion implantation step forms heavily-doped stripes 271 of p-type material in the exposed surfaces of the semiconductor layer structure 250. The stripes 271 extend in a second direction (the y-direction) to cross the gate trenches 260. The second direction may be perpendicular to the first direction (i.e., to the direction in which the gate trenches 260 extend), as shown. As shown, the stripes 271 may be formed in upper and side surfaces of the source regions 240, in side surfaces of the p-wells 232 that are exposed by the gate trenches 260, in side surfaces of the drift region 220 that are exposed by the gate trenches 260, and in the top surface of the deep shielding regions 270. The stripes 271 of highly doped p-type material therefore electrically connect the deep shielding regions 270 to the p-wells 232, and hence act as deep shielding connection patterns 272. Once again, since the deep shielding connection patterns 272 extend to the top surface of the semiconductor layer structure 250, the p-wells 232 need not extend to the top surface of the semiconductor layer structure 250.

The deep shielding connection patterns 272 need not extend all the way through the sidewalls of the gate trenches 260, but instead may only extend in a surface region of the sidewalls and in surface regions of the top surfaces of the source regions 242 and the top surfaces of the deep shielding regions 270 (see FIG. 3F). Consequently, a much lower implant energy may be used to form the deep shielding connection patterns 272 as compared to the deep shielding connection patterns 172, which may result in less damage to the semiconductor crystal.

Referring to FIGS. 3E and 3F, a gate oxide layer 262 is formed (e.g., by oxidation or deposition) on the bottom surface and sidewalls of each gate trench 260, and gate electrodes 264 are formed on the gate oxide layers 262 to fill the respective gate trenches 260. An inter-metal dielectric layer 266, a source contact 280 and a drain contact 282 are then formed. The gate oxide layers 262, gate electrodes 264, inter-metal dielectric layer 266 source contact 280, and drain contact 282 may be formed in the same manner as described above with reference to FIGS. 2E and 2F, and hence further description thereof will be omitted. Gate contacts (not shown) may also be formed in a conventional manner.

As can be seen, the MOSFET 200 may be very similar to the MOSFET 100, with the primary difference being that the deep shielding connection patterns 272 are only formed along the upper and side surfaces of the gate trenches 260 and source regions 240 instead of extending completely through the pillars that define the gate trenches 260. As with MOSFET 100 of FIGS. 2A-2F, the deep shielding connection patterns 272 may occupy only 15%-25% of the surface area of the sidewalls of the gate trenches 260 in example embodiments. In other embodiments, the extent of the deep shielding connection patterns 272 in the first direction may be between 10%-30%, between 10% and 40%, between 20% and 40% or between 30% and 40% of the extent of the regions of the sidewalls of the gate trenches 260 that are between the deep shielding connection patterns 272. All such embodiments may provide improved performance as compared to the MOSFET 100 of FIGS. 1A-1D.

FIGS. 4A-4D are schematic perspective views that illustrate a method of fabricating a semiconductor layer structure of a gate trench power MOSFET 300 according to still further embodiments of the present invention. FIGS. 4E and 4F are schematic cross-sectional views taken along lines 4E-4E and 4F-4F of FIG. 4D, respectively, that illustrate cross-sectional views of the gate trench power MOSFET 300 of FIG. 4D after metallization has been formed on the semiconductor layer structure. The MOSFET 300 may be almost identical to the MOSFET 200 described above, but is fabricated using a slightly different technique.

Figure 4A:
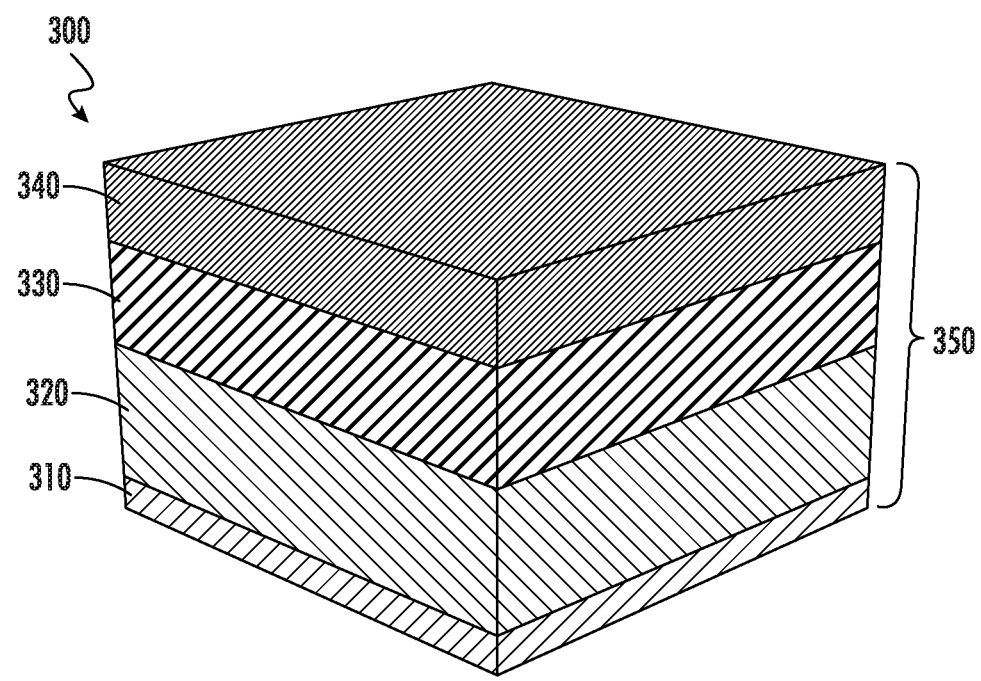
FIGS. 4A-4D are schematic perspective views that illustrate a method of fabricating a semiconductor layer structure of a gate trench power MOSFET according to still further embodiments of the present invention.

Referring to FIG. 4A, a semiconductor layer structure 350 is formed that includes a heavily-doped (n$^+$) n-type silicon carbide substrate 310, a lightly-doped (n$^-$) silicon carbide drift region 320, a moderately-doped p-type well layer 330, and a moderately-doped (n) n-type silicon carbide source layer 340 that are sequentially stacked. The semiconductor layer structure 350 may be identical to the semiconductor layer structure 250 discussed above, except that the n-type silicon carbide source layer 340 is not as heavily doped in this embodiment. For example, the n-type silicon carbide source layer 340 may be doped to a concentration of less than $1\times10^{20}$ atoms/cm$^3$.

Figure 4B:
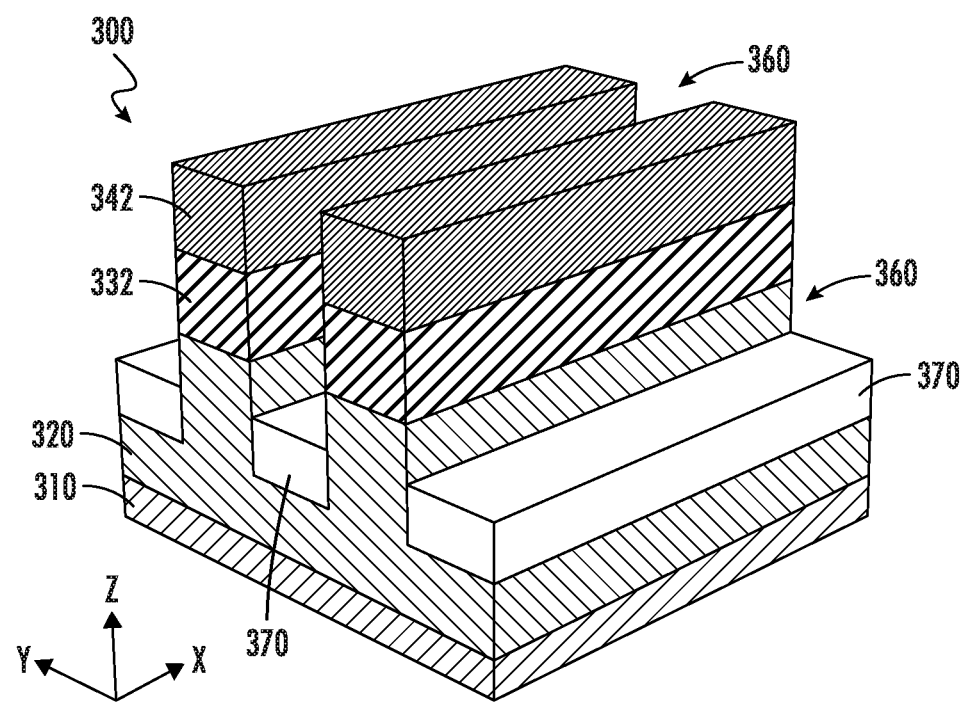

Referring to FIG. 4B, a plurality of gate trenches 360 are formed that may be identical to the gate trenches 260 discussed above. The gate trenches 360 convert the n-type silicon carbide layer 340 into a plurality of spaced apart n-type regions 342 and converts the moderately-doped p-type silicon carbide layer 330 into a plurality of p-wells 332. Heavily-doped p$^+$ silicon carbide deep shielding regions 370 are formed underneath each gate trench 360 by ion implantation.

Figure 4C:
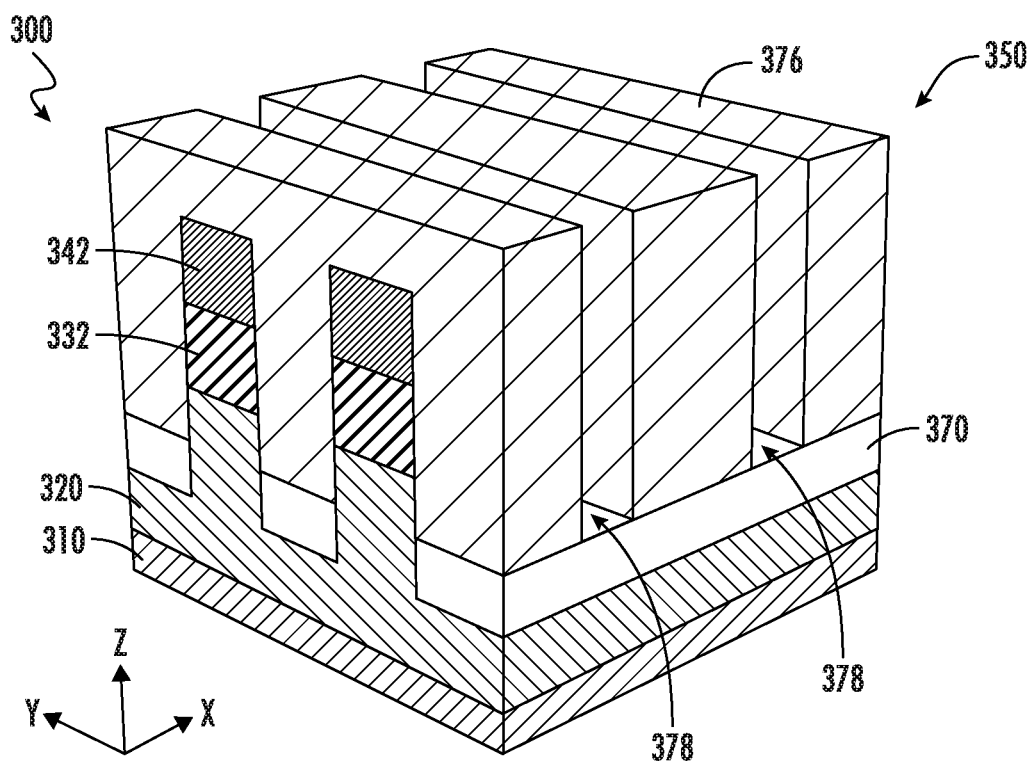

Referring to FIG. 4C, a photoresist implant blocking mask 376 is formed on the structure of FIG. 4B, and the photoresist implant blocking mask 376 is patterned to form a plurality of striped openings 378 therein. A higher energy, high dosage non-angled (i.e., perpendicular to the surface) ion implant is performed that further dopes the exposed portions of the deep shielding regions 370. The mask 376 may be removed once the ion implantation step is completed. The high energy, high dosage ion implant may be performed, for example, at an implant energy of between 100 kV and 2000 kV with a dosage of between $1\times10^{13}$ and $1\times10^{15}$. In other example embodiments, the implant energy may be between 200 kV and 2000 kV, between 400 kV and 2000 kV or between 500 kV and 2000 kV in each case with a dosage of between $1\times10^{13}$ and $1\times10^{15}$.

Figure 4D:
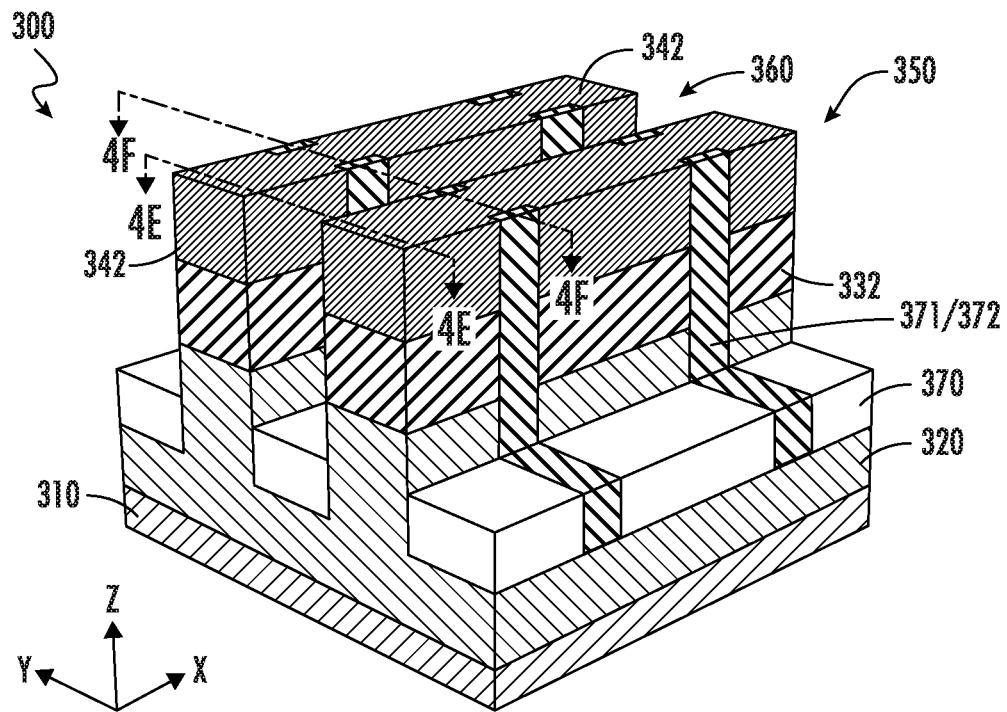
Figure 4E:
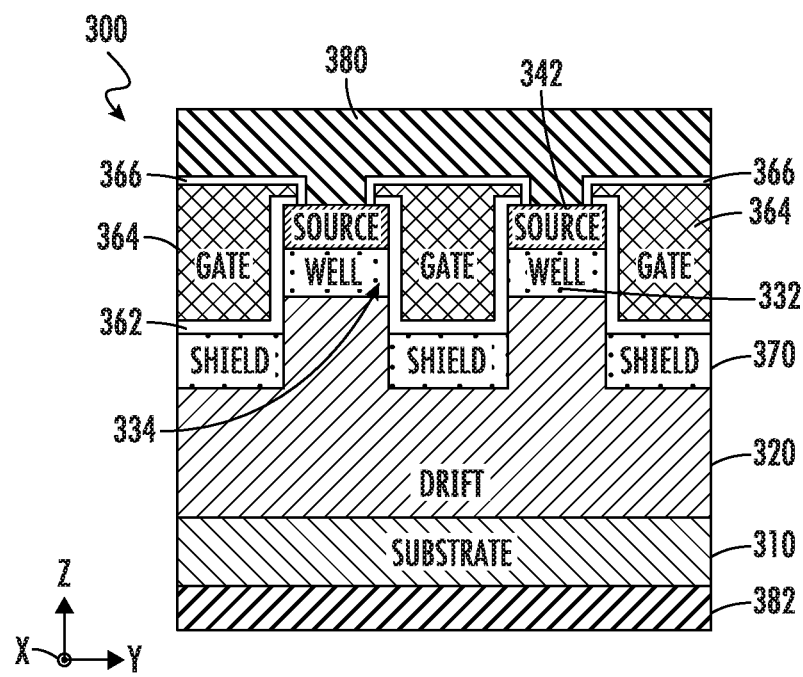
FIGS. 4E and 4F are schematic cross-sectional views taken along lines 4E-4E and 4F-4F of FIG. 4D, respectively, that illustrate cross-sectional views of the gate trench power MOSFET of FIG. 4D after metallization has been formed on the semiconductor layer structure.
Figure 4F:
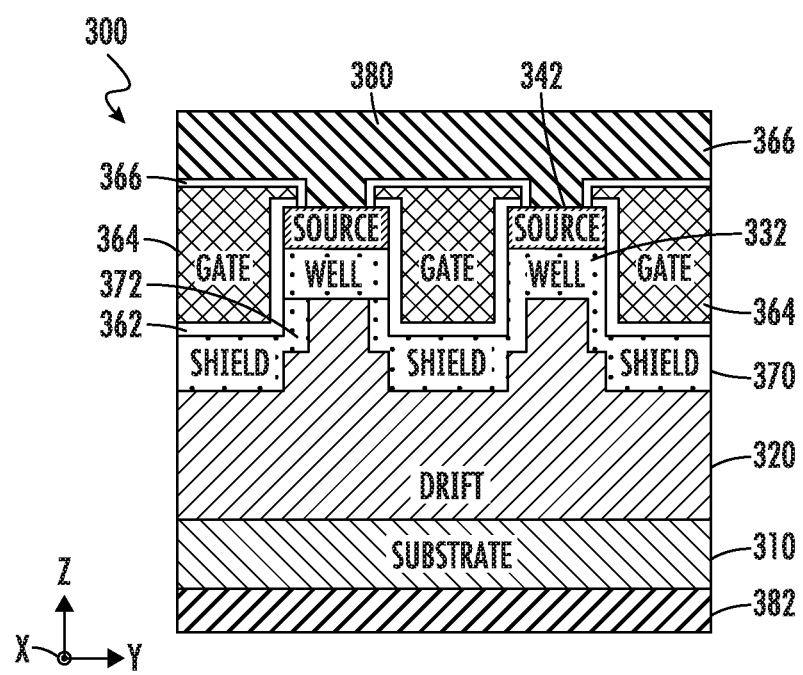

Referring to FIG. 4D, during the high energy ion implantation step shown in FIG. 4C, some of the p-type ions will reflect or "scatter" off the top surface of the deep shielding region 370 and embed into the portions of the sidewalls of the gate trenches 360 that are exposed by the openings 378 in the mask 376. These scattered ions convert the exposed upper portions of the n-type drift region 320 into p-type material that electrically connects the deep shielding regions 370 to the p-wells 332, and also increase the p-type doping concentration of the portions of the deep shielding regions 370 and p-wells 332 that are exposed by the openings 378. As a result, stripes 371 of p-type material are formed in the exposed surfaces of the semiconductor layer structure 350. These stripes 371 extend in a second direction (the y-direction) to cross the gate trenches 360. Generally speaking, the reflected ions tend to reflect into the lower portions of the exposed sidewalls of the gate trenches 360, and hence in some cases the stripes 371 may not extend into the source regions 342 since not enough p-type ions are reflected into the exposed portions of the source regions 342, as shown in FIG. 4D. As such, the stripes 371 may be discontinuous stripes. The stripes 371 of highly doped p-type material therefore electrically connect the deep shielding regions 370 to the p-wells 332, and hence act as deep shielding connection patterns 372. The ion implant discussed above with reference to FIG. 4C is performed at a high enough dosage to ensure that the exposed sidewalls of the source regions 342 are converted to highly-doped p-type regions so that the stripes 371 of highly doped p-type material extend all the way to the upper surface of the semiconductor layer structure 350, as shown in FIG. 4D.

Referring to FIGS. 4E and 4F, gate oxide layers 362 and gate electrodes 364 are formed in the gate trenches 360, and an inter-metal dielectric layer 366, a source contact 380 and a drain contact 382 are then formed. The gate oxide layers 362, gate electrodes 364, inter-metal dielectric layer 366, source contact 380 and drain contact 382 may be formed in the same manner as described above with reference to FIGS. 2E and 2F, and hence further description thereof will be omitted. Gate contacts (not shown) may also be formed in a conventional manner. As shown in FIG. 4F, the deep shielding connection patterns 372 do not extend all the way through the sidewalls of the gate trenches 360, but instead may only extend in a surface region of the sidewalls. Additionally, the deep shielding connection patterns 372 may not extend into the source regions 342 in this embodiment.

As with MOSFET 100 of FIGS. 2A-2F, the deep shielding connection patterns 372 may occupy only 15%-25% of the surface area of the sidewalls of the gate trenches 260 in example embodiments. In other embodiments, the extent of the deep shielding connection patterns 372 in the first direction may be between 10%-30%, between 10% and 40%, between 20% and 40% or between 30% and 40% of the extent of the regions of the sidewalls of the gate trenches 260 that are between the deep shielding connection patterns 372. All such embodiments may provide improved performance as compared to the MOSFET 100 of FIGS. 1A-1D.

Figure 4G:
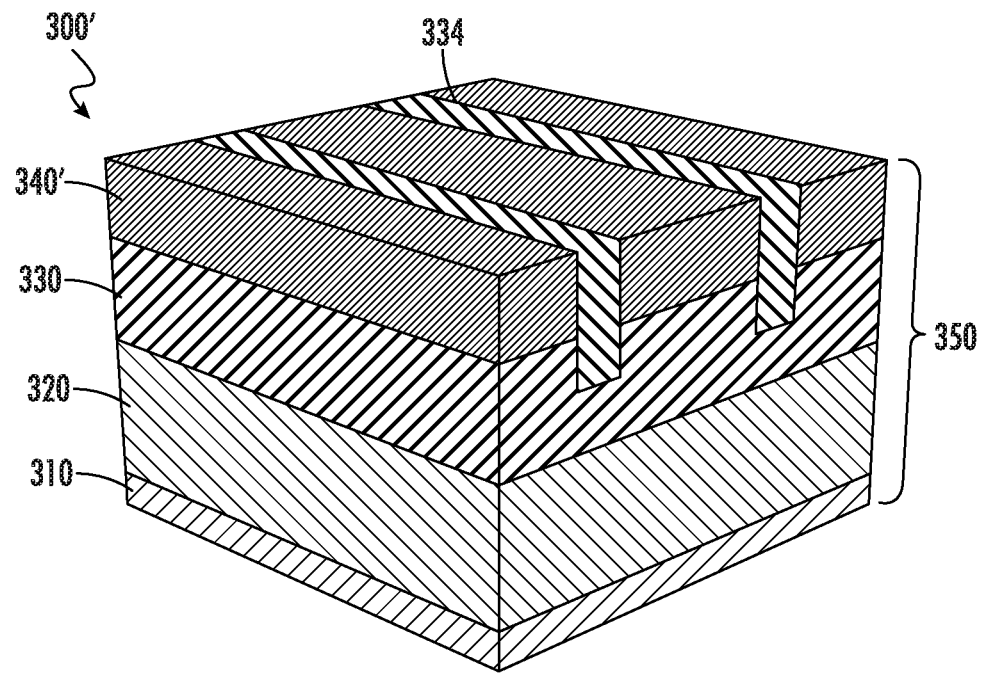
FIGS. 4G and 4H are schematic perspective views that illustrate a modified version of the MOSFET 300 of FIGS. 4A-4F.
Figure 4H:
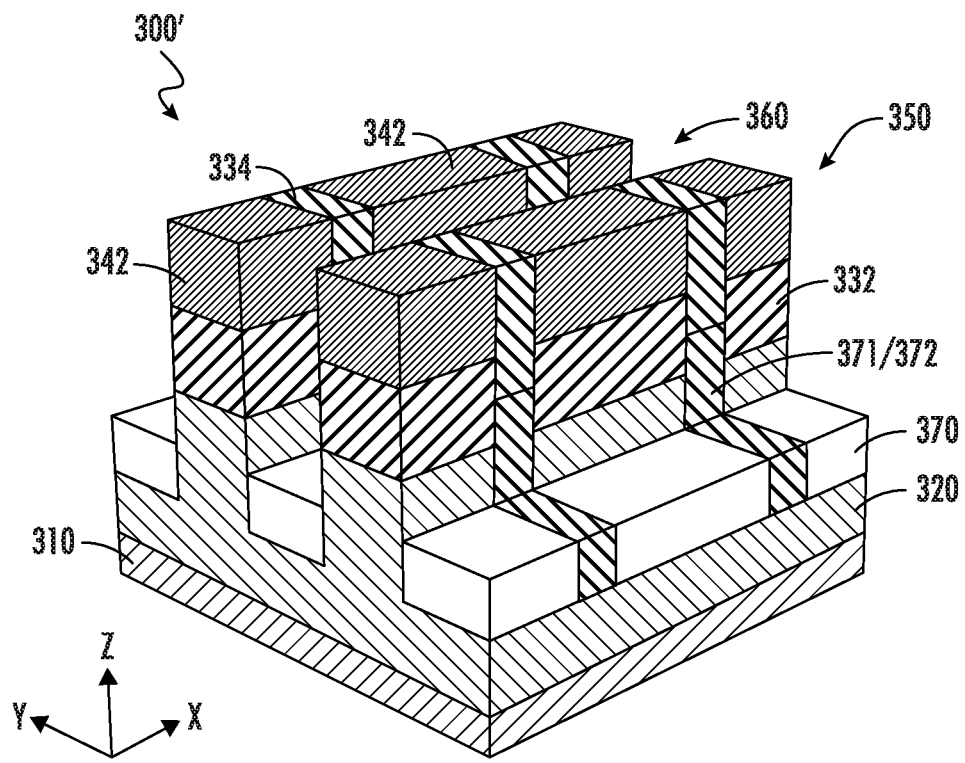

FIGS. 4G and 4H illustrate a method of forming a MOSFET 300' that is a modified version of the MOSFET 300 described above with reference to FIGS. 4A-4F. In particular, FIG. 4G is a schematic perspective view that corresponds to FIG. 4A, and FIG. 4H is a schematic perspective view that corresponds to FIG. 4A.

As shown in FIG. 4G, in this alternative embodiment, the moderately-doped p-type well layer 330 of FIG. 4A is grown as a thicker moderately-doped p-type well layer 330', and the heavily-doped (n$^+$) n-type silicon carbide source layer 340 of FIG. 4A is replaced with a heavily-doped (n$^+$) n-type silicon carbide pattern 340' that is selectively implanted using an implant mask (not shown) into the moderately-doped p-type well layer 330'. As a result, the moderately-doped p-type well layer 330' includes a plurality of upwardly extending stripes 334 that extend to the upper surface of the semiconductor layer structure 350.

As shown in FIG. 4H, after the processing steps discussed above with reference to FIGS. 4B and 4C are performed, the structure shown in FIG. 4H is formed. A lower dosage ion implantation step may be performed so that the stripes of p-type material that are formed via the scattering of ions do not extend as far up the sidewalls of the gate trenches 360, and instead may only extend onto the p-wells 332. The above discussed upwardly extending stripes 334 provide the p-type connection to the upper surface of the semiconductor layer structure 350. The MOSFET 300' may otherwise be the same as the MOSFET 300, and hence further description thereof will be omitted.

Figure 5A:
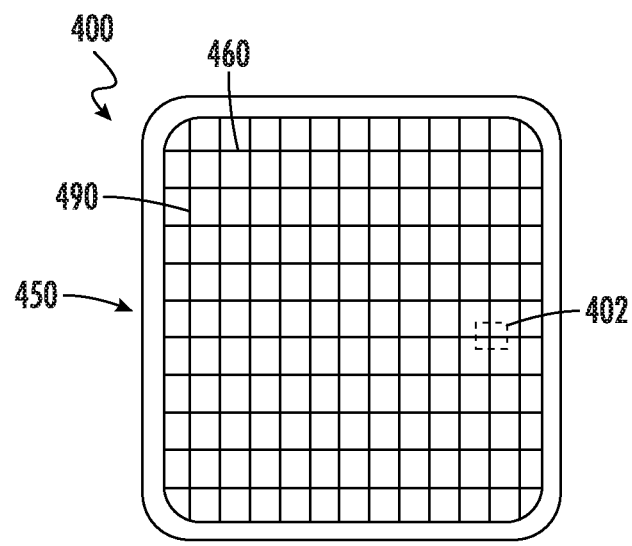
FIG. 5A is a perspective view of gate trench power MOSFET according to additional embodiments of the present invention.
Figure 5B:
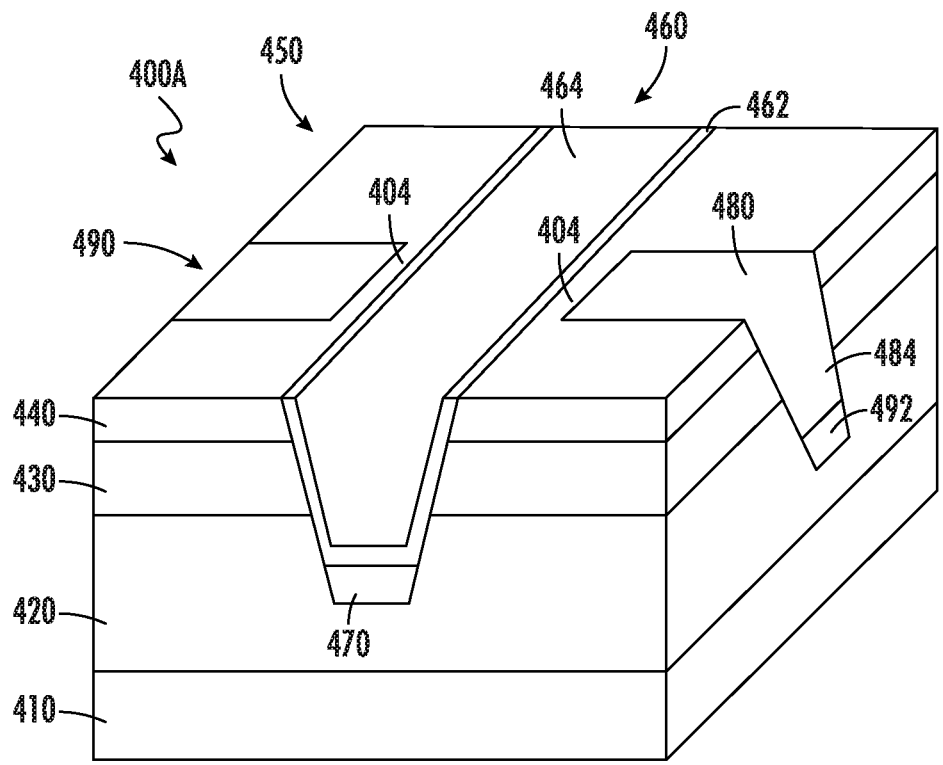
FIG. 5B is a schematic perspective view of a small region of the gate trench power MOSFET of FIG. 5A.

FIG. 5A is a schematic cross-sectional view of gate trench power MOSFET 400 according to additional embodiments of the present invention, where the cross section is taken along the plane defined by the top surface of the semiconductor layer structure of the device. FIG. 5B is a schematic perspective view of a small region of the gate trench power MOSFET 400 of FIG. 5A (region 402 of FIG. 5A).

As shown in FIG. 5A, a top surface of a semiconductor layer structure 450 of the device is shown. A plurality of gate trenches 460 extend in parallel in a first direction across an upper surface of the semiconductor layer structure 450. A plurality of source trenches 490 extend in parallel in a second direction across the upper surface of the semiconductor layer structure 450. The source trenches 490 are shown extending perpendicularly to the gate trenches 460, but embodiments of the present invention are not limited thereto.

Referring to FIG. 5B, the gate trench power MOSFET 400 includes a heavily-doped (n$^+$) n-type silicon carbide substrate 410, a lightly-doped (n$^-$) silicon carbide drift region 420, a moderately-doped p-type well layer 430, and a heavily-doped (n$^+$) n-type silicon carbide source layer 440 that are sequentially stacked. These layers 410, 420, 430, 440 may be formed in the same fashion and have the same characteristics (e.g., thickness, doping densities, etc.) as the corresponding layers of gate trench power MOSFET 100 discussed above, so further description thereof will be omitted. The substrate 410, drift region 420, well layer 430 and source layer 440 comprise the semiconductor layer structure 450.

Both the gate trenches 460 and the source trenches 490 extend through the source layer 440 to define source regions 442 and through the p-type well layer 430 to define p-wells 432. The gate trenches 460 and source trenches 490 also extend into the upper surface of the drift region 420. In some embodiments, the gate trenches 460 and the source trenches 490 may have the same depth from the upper surface of the semiconductor layer structure 450 and/or may be formed in the same etching process. In this embodiment, the source trenches 490 do not extend all the way to the gate trenches 460 so that a pillar 404 of semiconductor material is provided on each side of each gate trench 450 at locations where the gate trench 460 crosses the source trenches 490. The pillars 404 provide walls between each gate trench 490 and its intersecting source trenches 490 on which the gate oxide layers may be formed, as discussed below. Each source trench 490 therefore comprises a segmented source trench that includes a plurality of collinear spaced-apart segments.

Gate oxide layers 462 and gate electrodes 464 are formed within the gate trenches 460. The gate oxide layer 462 may be formed by oxidation or deposition on the bottom surface and sidewalls of each gate trench 460. The gate electrodes 464 are formed on the gate oxide layers 462 to fill the respective gate trenches 460. The gate oxide layers 462 and gate electrodes 464 extend continuously through the respective gate trenches 460 in the depicted embodiment. Respective protrusions 484 of a source contact 480 are formed within the respective source trenches 490. The source contact 480 may be a monolithic source contact 480 in some embodiments that includes downward protrusions 484 that extend into the respective source trenches 490. FIG. 5B does not show the portion of the source contact 480 that is above the protrusions 484 and only depicts two of the downward protrusions 484 that extend into first and second portions of a segmented source trench 490. It will be appreciated that an inter-metal insulation pattern (not shown) is provided on the top surface of the semiconductor layer structure and the gate electrodes that isolates the gate electrodes 464 from the source contact 480, and that the protrusions 484 of source contact 480 extend through openings in this inter-metal insulation pattern to fill the source trenches 490. It will also be appreciated that the MOSFET 400 will include connections (not shown) between each gate electrode 464 and a gate terminal (not shown) and will also include a drain contact (not shown) on the bottom of the semiconductor substrate 410.

As is further shown in FIG. 5B, heavily-doped p$^+$ silicon carbide deep shielding regions 492 are formed underneath each source trench 490. The deep shielding regions 492 may be formed by implanting p-type dopants into the bottom surface of each source trench 490 before the source contact 480 (including protrusions 484) is formed. The p-type shielding patterns 492 may be formed via a high energy, high dosage ion implantation step that converts the portions of the lightly-doped n-type drift region 420 that are under the source trenches 490 into heavily doped p-type regions.

As is also shown in FIG. 5B, heavily-doped p$^+$ silicon carbide deep shielding regions 470 may optionally be formed underneath each gate trench 460. The deep shielding regions 470 may be formed by implanting p-type dopants into the bottom surface of each gate trench 490 before gate oxide layers 462 and gate electrodes 464 are formed within the gate trenches 460. The p-type shielding patterns 470 may be formed via a high energy, high dosage ion implantation step that converts the portions of the lightly-doped n-type drift region 420 that are under the gate trenches 460 into heavily doped p-type regions. The deep shielding regions 492 and the deep shielding regions 470 (if provided) may be formed via the same ion implantation process.

The bottom portions of the pillars 404 that are interposed between the gate trenches 460 and the source trenches 490 may be implanted with p-type ions during the ion implantation process in order to convert the bottom portions of the pillars to p-type material in order to provide an electrical connection between the deep shielding regions 492 and the deep shielding regions 470 (if provided). In some cases, the bottom portions of the pillars 404 (an the region underneath each pillar 404) may be sufficiently implanted with p-type ions to provide these electrical connections based on the straggle of the high energy p-type implant. In other cases, angled ion implants may be used to ensure that the bottom portions of the pillars 404 are converted to p-type material. Of course, if the deep shielding regions 470 are not provided, then there may be no reason to convert the bottom portions of the pillars 404 to p-type material.

The MOSFET 400 does not include any deep shielding connection patterns, as the source contact 480 directly contacts the deep shielding regions 492, and the deep shielding regions 492 directly contact the deep shielding regions 470. In effect, the deep shielding regions 492 serve as both deep shielding regions and also serve as deep shielding connection patterns that electrically connect the deep shielding regions 470 to the source contact 480. As noted above, the deep shielding regions 470 may be omitted in some embodiments.

The portions of the gate trenches 460 that border the source trenches 490 (i.e., the pillars 404) will not have semiconductor channel regions therein in cases where the bottom portions of the pillars are converted to p-type material. It is anticipated that the pitch of the source trenches 490 may be such that only about 15%-25% of the surface area of the sidewalls of the gate trenches 460 will be adjacent source trenches 490. Thus, the MOSFET 400 may also exhibit improved performance as compared to the conventional MOSFET 1 of FIGS. 1A-1E.

Figure 5C:
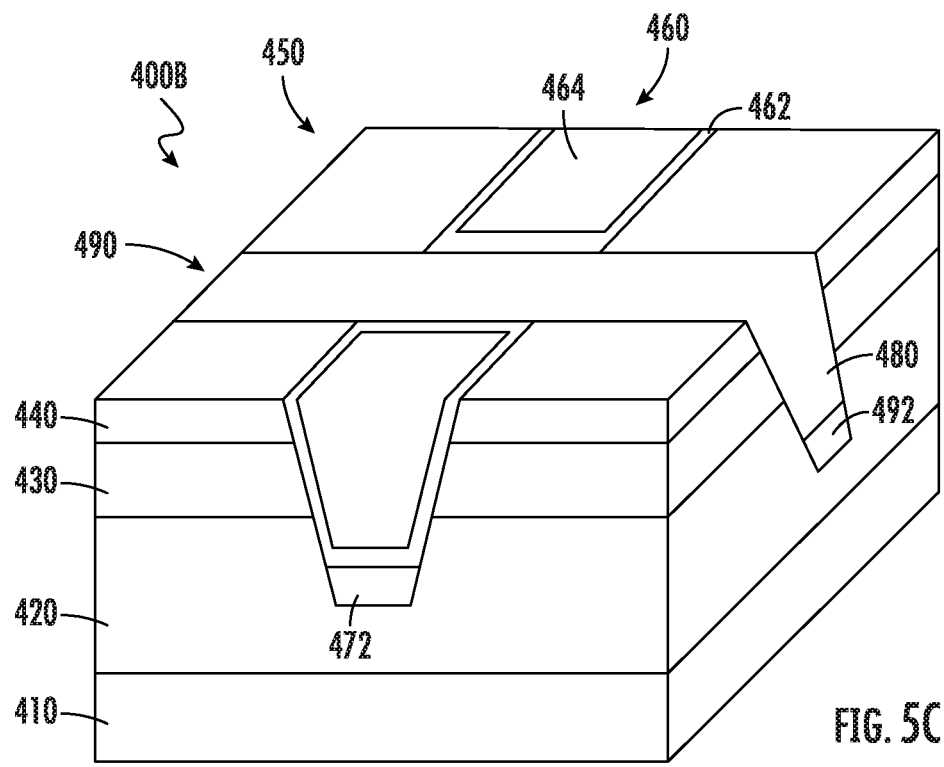
FIGS. 5C and 5D are schematic perspective views of small portions of respective modified versions of the gate trench power MOSFET of FIG. 5A.
Figure 5D:
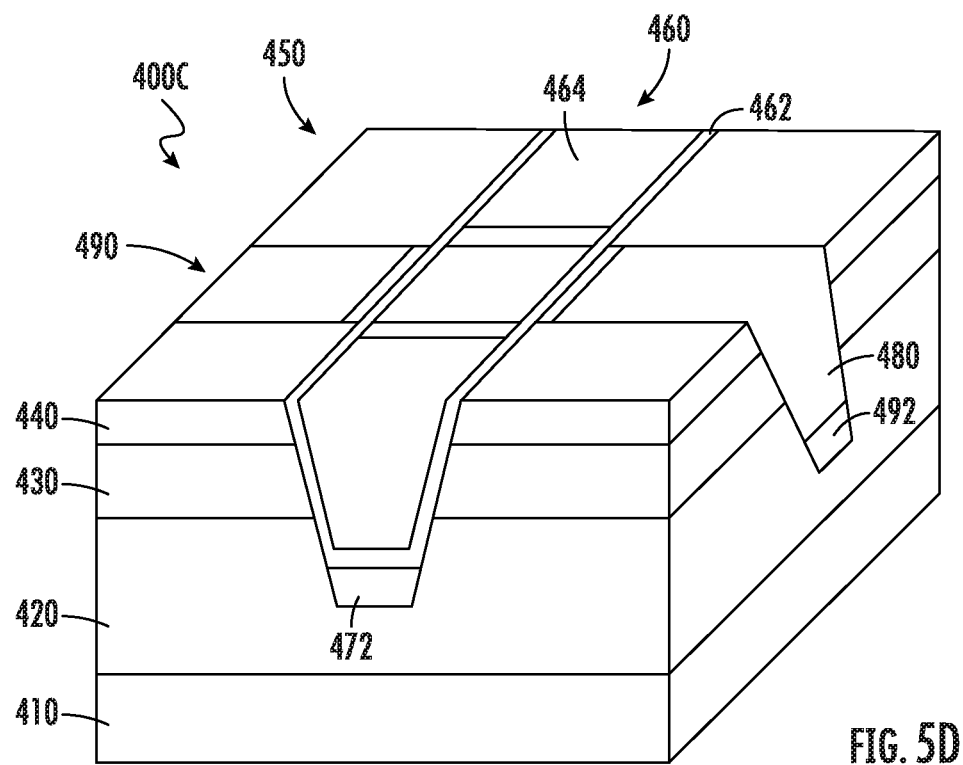

FIGS. 5C and 5D illustrate two modified embodiments 400B and 400C, respectively, of the MOSFET 400A of FIGS. 5A-5B. FIGS. 5C and 5D each correspond to the view of FIG. 5B.

As shown in FIG. 5C, the MOSFET 400B is similar to the MOSFET 400A shown in FIG. 5B. The primary difference between the two devices is that MOSFET 400A includes continuous gate trenches 460, gate dielectric layers 462 and gate electrodes 464 and segmented source trenches 490 and source contact protrusions 484, while MOSFET 400B includes continuous source trenches 490, and source contact protrusions 484 and segmented gate trenches 460, gate dielectric layers 462 and gate electrodes 464. As shown in FIG. 5D, MOSFET 400C combines the approach of segmenting the source trenches 490 and source contact protrusions 484 (as done in MOSFET 400A) and segmenting the gate trenches 460, gate dielectric layer 462 and gate electrodes 464 (as done in MOSFET 400B). As such, further description of these devices will be omitted.

FIGS. 6A-6E are schematic cross-sectional views that illustrate a method of fabricating a gate trench power MOSFET 500 according to still further embodiments of the present invention.

Figure 6A:
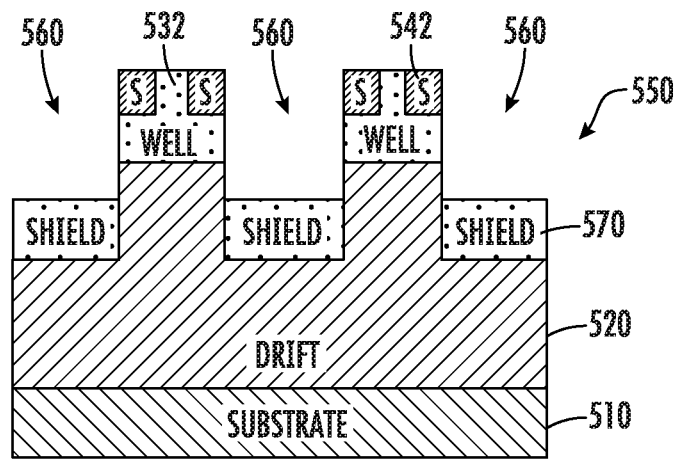
FIGS. 6A-6E are schematic perspective views that illustrate a method of fabricating a gate trench power MOSFET according to still further embodiments of the present invention.

As shown in FIG. 6A, a semiconductor layer structure 550 may be formed that includes a heavily-doped (n$^+$) n-type silicon carbide substrate 510, a lightly-doped (n$^-$) silicon carbide drift region 520, and a moderately-doped silicon carbide p-wells 532. Heavily-doped n$^+$ silicon carbide source regions 542 are formed in upper portions of the p-wells 532. Gate trenches 560 are formed in the upper surface of the semiconductor layer structure 550 in a conventional manner. Deep shielding regions 570 are formed via ion implantation underneath the gate trenches 560. The structure shown in FIG. 6A may be identical to the structure of the conventional MOSFET 1 discussed above with reference to FIG. 1B, and hence further description thereof will be omitted.

Figure 6B:
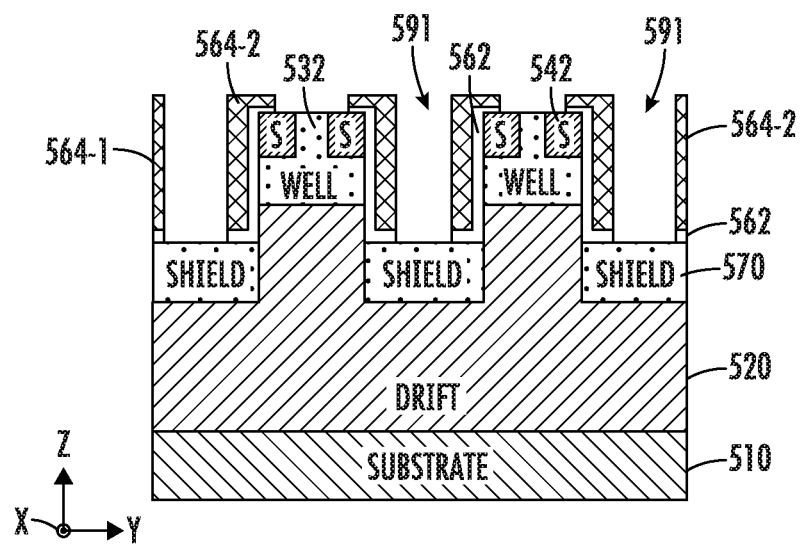

Referring to FIG. 6B, gate dielectric layers 562 are formed that cover the sidewalls and bottom surfaces of the gate trenches 560. The gate dielectric layers 562 may also extend onto the top surface of the semiconductor layer structure 550. Gate electrodes are then formed to fill the trenches 560. A mask (not shown) is then formed and the gate dielectric layers 562 and gate electrodes are etched to form preliminary source trenches 591 that expose central portions of the deep shielding regions 570 (i.e., central sections of the gate trenches 560 are reopened). The preliminary source trenches 591 may be continuous (i.e., they may extend the full lengths of the respective gate trenches) or may be discontinuous (they are shown as being continuous in FIG. 6B). The preliminary source trenches 591 may divide each gate electrode into first and second gate electrodes 564-1, 564-2.

Figure 6C:
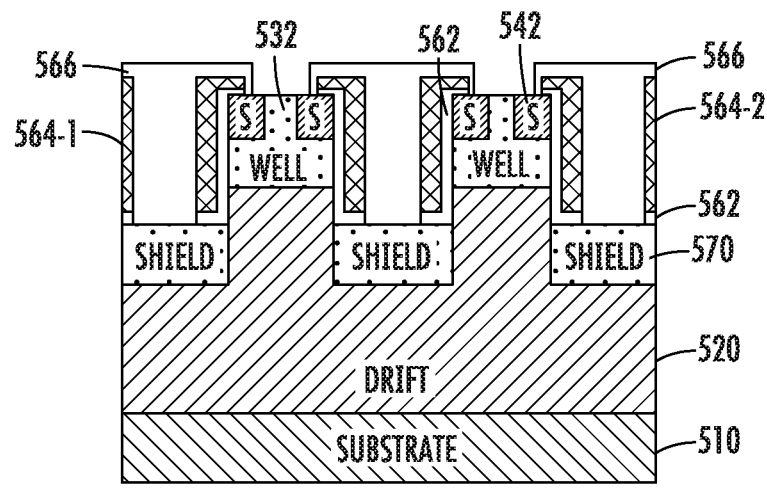

Referring to FIG. 6C, an inter-metal insulating pattern 566 is then formed that fills the preliminary source trenches 566 and that covers exposed portions of the gate electrodes 564-1, 564-2.

Figure 6D:
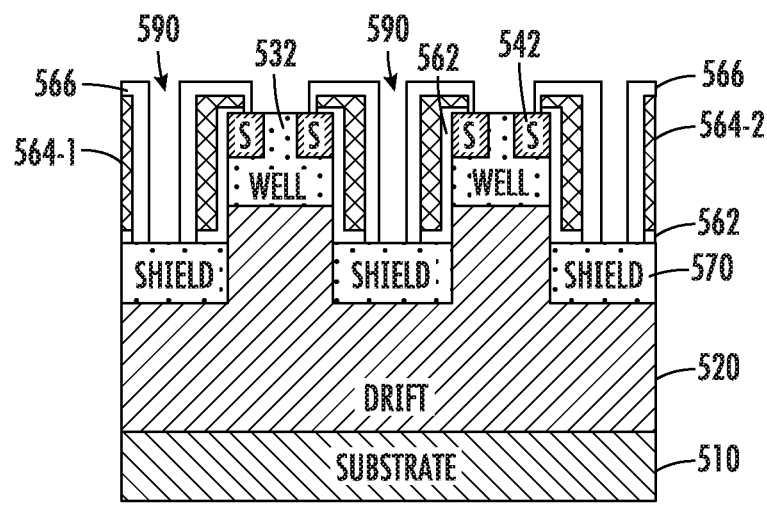

Referring to FIG. 6D, an etch mask (not shown) is formed and the inter-metal insulation pattern 566 is etched to form source trenches 590. Each source trench 590 extends through the center of a respective gate trench 560 to expose the deep shielding regions 570.

Figure 6E:
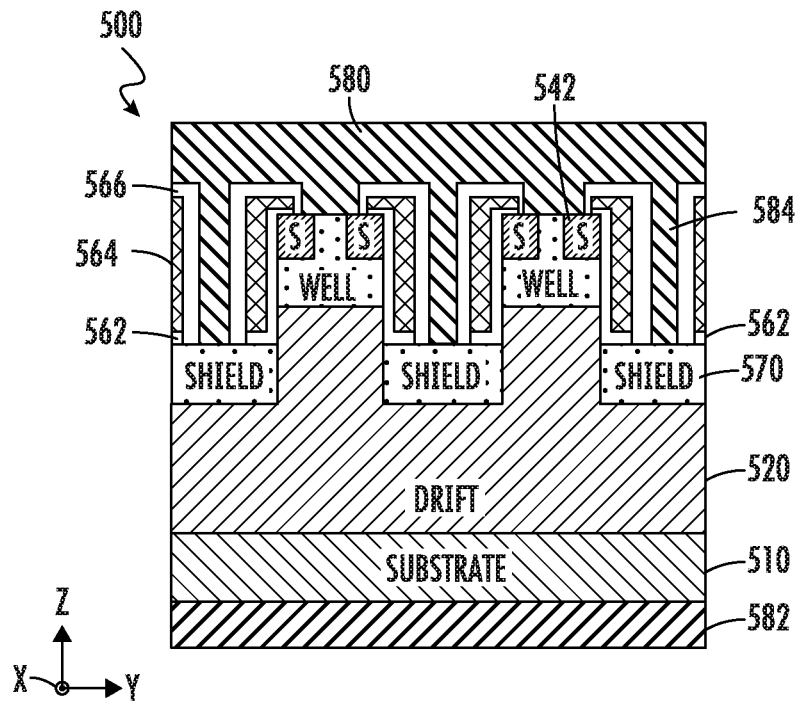

Referring to FIG. 6E, the source contact 580 is formed on the upper surface of the device. The source contact 580 includes downward protrusions 584 that fill the source trenches 590. The protrusions 584 directly contact the deep shielding regions 570 and hence provide a direct electrical connection between the source contact 580 and the deep shielding regions 570, eliminating any need for a separate deep shielding connection pattern.

By configuring the source contact 580 to extend through the gate trench 560 to directly contact the deep shielding regions 570, any need for a deep shielding connection pattern may be eliminated. In the depicted embodiment, each downward protrusion 584 of the source contact 580 extends the full length of the respective gate trench 560 in which it resides, and hence the first and second gate electrodes 564-1, 564-2 may be separate contacts that are only electrically connected to each other outside of the gate trenches 560. In other embodiments, the downward protrusions 584 may comprise plugs that do not extend the full length of the respective gate trench 560. In such embodiments, the first and second gate electrodes 564-1, 564-2 may be electrically connected to each other within the portions of the gate trenches 560 that do not include the plugs 584.

Figure 7:
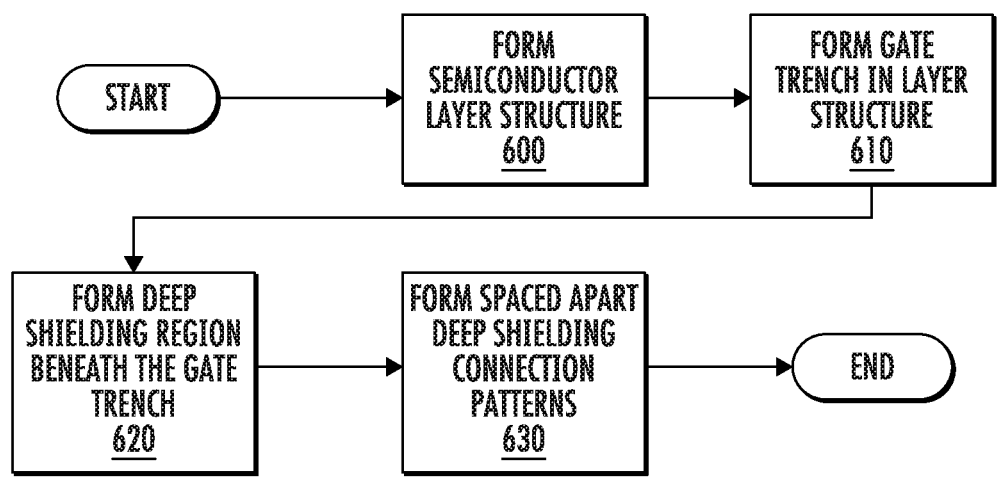
FIGS. 7-9 are flow charts illustrating methods of fabricating gate trench power semiconductor devices according to embodiments of the present inventive concepts.
Figure 8:
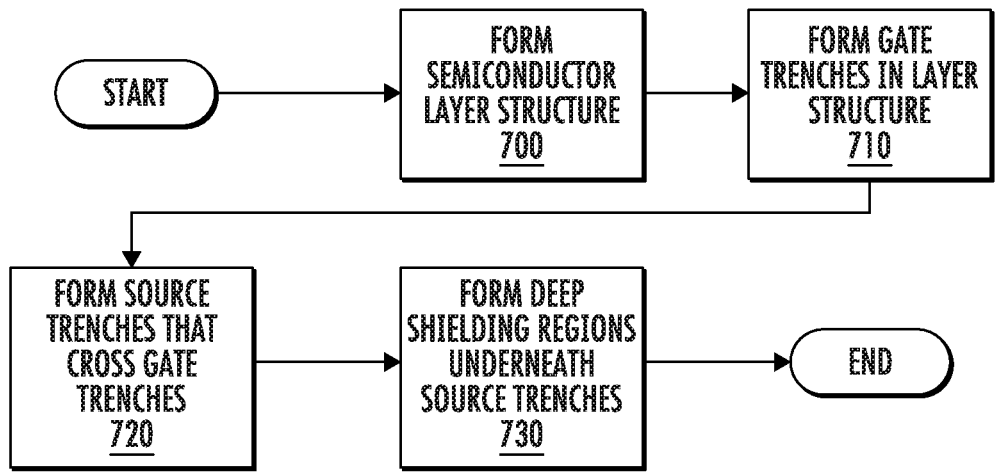
Figure 9:
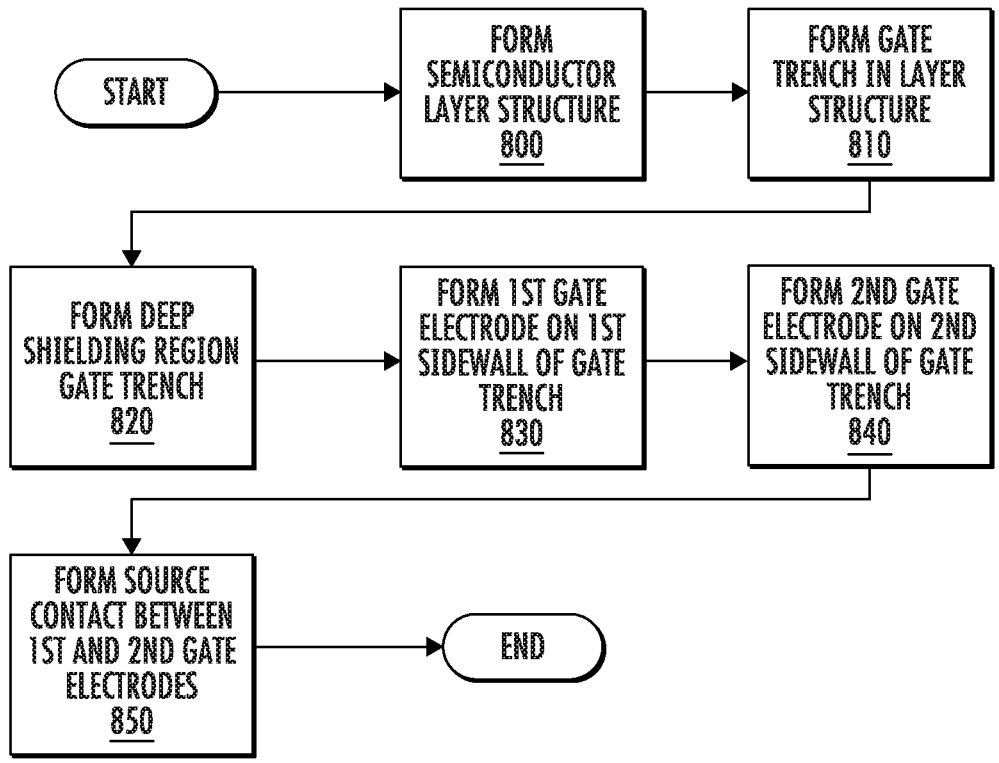

FIGS. 7-9 are flow charts that illustrate methods of fabricating gate trench power semiconductor devices according to embodiments of the present invention.

With reference to FIG. 7 and FIGS. 2A-4F, operations may begin with formation of a wide band-gap semiconductor layer structure (Block 600). The semiconductor layer structure may include a substrate and a plurality of semiconductor layers that are grown on the substrate by epitaxial growth and/or formed by ion implantation. The semiconductor layer structure may include a drift region that has a first conductivity type. The semiconductor layer structure may further include well regions having a second conductivity type on the drift region and source regions having the first conductivity type in upper portions of the well regions. A gate trench is formed in an upper surface of the semiconductor layer structure (Block 610). The gate trench may extend in a first direction and may have a bottom surface, a first sidewall that extends in the first direction and a second sidewall that extends in the first direction.

A deep shielding region having the second conductivity type is formed in the semiconductor layer structure underneath the bottom surface of the gate trench (Block 620). The deep shielding region may be formed by ion implantation. A plurality of spaced-apart deep shielding connection patterns are formed that extend in a second direction to cross the deep shielding pattern (Block 630). In some embodiments, the second direction may be perpendicular to the first direction. Channel regions may be defined in the sidewalls of the gate trench between the deep shielding connection patterns.

With reference to FIG. 8 and FIGS. 5A-5D, operations may begin with formation of a wide band-gap semiconductor layer structure (Block 700). The semiconductor layer structure may include a substrate and a plurality of semiconductor layers that are grown on the substrate by epitaxial growth and/or formed by ion implantation. The semiconductor layer structure may include a drift region that has a first conductivity type. The semiconductor layer structure may further include well regions having a second conductivity type on the drift region and source regions having the first conductivity type in upper portions of the well regions. A plurality of gate trenches are formed in an upper surface of the semiconductor layer structure (Block 710). The gate trenches may extend in a first direction and may be spaced apart from each other in a second direction that is perpendicular to the first direction. Each gate trench may have a bottom surface, a first sidewall that extends in the first direction and a second sidewall that extends in the first direction.

A plurality of source trenches are also formed in an upper surface of the semiconductor layer structure (Block 720). The source trenches cross the gate trenches and may extend in the second direction in some embodiments. The gate trenches and source trenches can be formed using a common etching process. A plurality of deep shielding regions having the second conductivity type are formed in the semiconductor layer structure underneath the bottom surface of the source trench (Block 730). The deep shielding regions may be formed by ion implantation. Deep shielding regions may optionally be formed underneath the respective gate trenches.

With reference to FIG. 9 and FIGS. 6A-6E, operations may begin with formation of a wide band-gap semiconductor layer structure (Block 800). The semiconductor layer structure may include a substrate and a plurality of semiconductor layers that are grown on the substrate by epitaxial growth and/or formed by ion implantation. The semiconductor layer structure may include a drift region that has a first conductivity type. The semiconductor layer structure may further include well regions having a second conductivity type on the drift region and source regions having the first conductivity type in upper portions of the well regions. A gate trench is formed in an upper surface of the semiconductor layer structure (Block 810). The gate trench may extend in a first direction and may have a bottom surface, a first sidewall that extends in the first direction and a second sidewall that extends in the first direction.

A deep shielding region having the second conductivity type is formed in the semiconductor layer structure underneath the bottom surface of the gate trench (Block 820). The deep shielding region may be formed by ion implantation. The deep shielding region may be formed by ion implantation. A first gate electrode is formed on the first sidewall of the gate trench (Block 830) and a second gate electrode is formed on the second sidewall of the gate trench (Block 840). The first and second gate electrodes may be formed as a monolithic gate electrode, and at least some of a middle portion of the monolithic gate electrode may be removed. A source contact is formed between the first and second gate electrodes (Block 850). The source contact may directly contact the deep shielding region.

In the description above, each example embodiment has a certain conductivity type. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOSFET, IGBT, etc.). Herein, where a contact can be either a source contact or a drain contact it may be referred to as a "source/drain contact."

While the present invention is described above with respect to power MOSFET and power IGBT implementations, it will be appreciated that the techniques described herein apply equally well to other similar vertical power devices having a gate trench. Thus, embodiments of the present invention are not limited MOSFETs and IGBTs, and the techniques disclosed herein may be used on any appropriate gate trench device.

The present invention has primarily been discussed above with respect to silicon carbide based power semiconductor devices. It will be appreciated, however, that silicon carbide is used herein as an example and that the devices discussed herein may be formed in any appropriate wide band-gap semiconductor material system. As an example, gallium nitride based semiconductor materials (e.g., gallium nitride, aluminum gallium nitride, etc.) may be used instead of silicon carbide in any of the embodiments described above.

It will also be appreciated that the different features of the different embodiments described herein may be combined to provide additional embodiments. For example, it was discussed above with respect to one embodiment that junction termination extensions could be used in place of guard rings. This is true in each embodiment disclosed herein. Likewise, the shield regions under the gate trenches may be included or omitted in any of the embodiments. Any of the embodiments may also include well regions that have varying dopant concentrations including lower doped channel regions.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to a flow chart. It will be appreciated that the steps shown in the flow chart need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That is which claimed is:
1. A power semiconductor device comprising:
a semiconductor layer structure comprising a drift region that comprises a wide band-gap semiconductor material, the drift region having a first conductivity type;
a gate trench in the semiconductor layer structure, the gate trench having a longitudinal axis that extends in a first direction and comprising first and second opposed sidewalls that extend parallel to the longitudinal axis;
first and second well regions having a second conductivity type that is different from the first conductivity type in the semiconductor layer structure above the drift region, the first well region comprising part of the first sidewall and the second well region comprising part of the second sidewall;
a deep shielding region having the second conductivity type in the semiconductor layer structure and extending continuously underneath the gate trench for the full length of the gate trench; and
a plurality of deep shielding connection patterns that have the second conductivity type in the semiconductor layer structure, the deep shielding connection patterns spaced apart from each other along the first direction, the deep shielding connection patterns establishing part of the first sidewall of the gate trench and establishing part of the second sidewall of the gate trench,
wherein the deep shielding connection patterns electrically connect the deep shielding region to the first and second well regions, and
wherein the deep shielding connection patterns have higher second conductivity type dopant concentrations than do the first and second well regions.

2. The power semiconductor device of claim 1, further comprising first and second source regions having the first conductivity type on top of the respective first and second well regions.

3. The power semiconductor device of claim 1, wherein the deep shielding connection patterns extend to an upper surface of the semiconductor layer structure.

4. The power semiconductor device of claim 1, wherein the deep shielding connection patterns sub-divide the first source region into a plurality of spaced apart segments and sub-divide the second source region into a plurality of spaced apart segments.

5. The power semiconductor device of claim 1, wherein portions of the deep shielding region that are aligned along the second direction with the respective deep shielding connection patterns have higher doping concentrations of second conductivity type dopants than do a remainder of the deep shielding region.

6. The power semiconductor device of claim 1, further comprising:
a gate insulation layer in the gate trench that covers a bottom surface and the first and second sidewalls of the gate trench;
a gate electrode in the gate trench on the gate insulation layer;
a first source/drain contact that directly contacts the first source region, the second source region and the deep shielding connection patterns; and
a second source/drain contact on a lower surface of the semiconductor layer structure.

7. The power semiconductor device of claim 1, wherein the wide band-gap semiconductor comprises silicon carbide.

8. The power semiconductor device of claim 1, further comprising:
an additional plurality of gate trenches in the upper portion of the semiconductor layer structure, each of the additional plurality of gate trenches comprising respective first and second opposed sidewalls that extend in the first direction;
an additional plurality of deep shielding regions having the second conductivity type in the semiconductor layer structure underneath the respective additional plurality of gate trenches;
wherein each of the deep shielding connection patterns extends continuously in the second direction and is formed in both the first sidewall and the second sidewall of each of the respective additional plurality of gate trenches; and
an additional plurality of semiconductor channel regions that have the second conductivity type in the first and second sidewalls of the respective additional plurality of gate trenches, the semiconductor channel regions positioned between adjacent deep shielding connection patterns in each of the additional plurality of gate trenches.

9. The power semiconductor device of claim 1, wherein the first and second well regions do not extend to the upper surface of the semiconductor layer structure.

10. A power semiconductor device comprising:
a semiconductor layer structure comprising a drift region that comprises a wide band-gap semiconductor material, the drift region having a first conductivity type;
a gate trench in an upper portion of the semiconductor layer structure, the gate trench having a longitudinal axis that extends in a first direction and comprising first sidewall and a second sidewall opposite the first sidewall, the first and second sidewalls extending parallel to the longitudinal axis;
first and second well regions having a second conductivity type that is different from the first conductivity type in the semiconductor layer structure above the drift region, the first well region comprising part of the first sidewall and the second well region comprising part of the second sidewall;
a deep shielding region having the second conductivity type in the semiconductor layer structure underneath the gate trench; and
a plurality of deep shielding connection patterns that have the second conductivity type in the semiconductor layer structure, the deep shielding connection patterns spaced apart from each other along the first direction, the deep shielding connection patterns extending in a second direction that is different from the first direction, at least some of the deep shielding connection patterns establishing part of the first sidewall and establishing part of the second sidewalk,
wherein the deep shielding connection patterns electrically connect the deep shielding region to the first and second well regions and have a higher doping concentration than the first and second well regions, and
wherein the first and second well regions do not extend to an upper surface of the semiconductor layer structure.

11. The power semiconductor device of claim 2, wherein the deep shielding region extends continuously underneath the gate trench for the full length of the gate trench.

12. A power semiconductor device comprising:
a semiconductor layer structure comprising a drift region that comprises a wide band-gap semiconductor material, the drift region having a first conductivity type;
a gate trench in an upper portion of the semiconductor layer structure, the gate trench having a longitudinal axis that extends in a first direction and comprising first and second opposed sidewalls that each extend in the first direction;
a first gate electrode on the first sidewall of the gate trench;
a second gate electrode on the second sidewall of the gate trench;
a deep shielding region having a second conductivity type that is different from the first conductivity type in the semiconductor layer structure underneath the gate trench, the deep shielding region defining a bottom surface of the gate trench; and
a source contact in the gate trench between the first and second gate electrodes,
wherein a portion of the source contact that is within the gate trench directly contacts the deep shielding region.

13. The power semiconductor device of claim 12, further comprising a first gate dielectric layer between the first sidewall of the gate trench and the first gate electrode; and
a second gate dielectric layer between the second sidewall of the gate trench and the second gate electrode.

14. The power semiconductor device of claim 12, further comprising:
a first inter-metal dielectric layer that is in the gate trench between the first gate electrode and the source contact; and
a second inter-metal dielectric layer that is in the gate trench between the second gate electrode and the source contact.

15. A power semiconductor device comprising:
a semiconductor layer structure comprising a drift region, the drift region having a first conductivity type;
a gate trench in the semiconductor layer structure, the gate trench having a longitudinal axis that extends in a first direction and comprising first and second opposed sidewalls that extend parallel to the longitudinal axis;
first and second well regions having a second conductivity type that is different from the first conductivity type in the semiconductor layer structure, the first well region comprising part of the first sidewall and the second well region comprising part of the second sidewall;
a deep shielding region having the second conductivity type in the semiconductor layer structure underneath the gate trench; and
a plurality of deep shielding connection patterns that have the second conductivity type in the semiconductor layer structure, the deep shielding connection patterns spaced apart from each other along the first direction, the deep shielding connection patterns extending in a second direction that is different from the first direction,
wherein at least some of the deep shielding connection patterns extend as continuous stripes in the second direction underneath both the gate trench and at least one additional gate trench in the semiconductor layer structure, and
wherein the deep shielding connection patterns have higher second conductivity type dopant concentrations than do the first and second well regions.

16. The power semiconductor device of claim 15, wherein the deep shielding connection patterns extend to an upper surface of the semiconductor layer structure.

17. The power semiconductor device of claim 16, wherein the first and second well regions do not extend to the upper surface of the semiconductor layer structure.

18. A power semiconductor device comprising:
a semiconductor layer structure comprising a drift region that comprises a wide band-gap semiconductor material, the drift region having a first conductivity type;
a gate trench in the semiconductor layer structure, the gate trench having a longitudinal axis that extends in a first direction and comprising first and second opposed sidewalls that each extend parallel to the longitudinal axis;
first and second well regions having a second conductivity type that is different from the first conductivity type in the semiconductor layer structure, the first well region comprising part of the first sidewall and the second well region comprising part of the second sidewall;
a deep shielding region having the second conductivity type in the semiconductor layer structure underneath the gate trench; and
a plurality of deep shielding connection patterns that have the second conductivity type in the semiconductor layer structure, the deep shielding connection patterns spaced apart from each other along the first direction, the deep shielding connection patterns extending in a second direction that is different from the first direction, wherein the deep shielding connection patterns electrically connect the deep shielding region to the first and second well regions, and wherein portions of the deep shielding region that are aligned along the second direction with the respective deep shielding connection patterns have higher doping concentrations of second conductivity type dopants than do a remainder of the deep shielding region.

19. A power semiconductor device comprising:
a semiconductor layer structure comprising a drift region that has a first conductivity type;
a gate trench in the semiconductor layer structure, the gate trench having a longitudinal axis that extends in a first direction;
a first well region and a second well region in the semiconductor layer structure on respective sides of the gate trench, the first and second well regions having a second conductivity type that is different from the first conductivity type;
first and second source regions having the first conductivity type on top of the respective first and second well regions;
a deep shielding region having the second conductivity type in the semiconductor layer structure underneath the gate trench; and
a deep shielding connection pattern that has the second conductivity type in the semiconductor layer structure, the deep shielding connection pattern extending onto top surfaces of the respective first and second source regions.

20. The power semiconductor device of claim 19, wherein the deep shielding region extends continuously underneath the gate trench for the full length of the gate trench.

21. The power semiconductor device of claim 19, further comprising a plurality of additional deep shielding connection patterns, the deep shielding connection pattern and the plurality of additional deep shielding connection patterns spaced apart from each other along the first direction and extending in a second direction that is different from the first direction.

22. The power semiconductor device of claim 19, wherein the deep shielding connection pattern electrically connects the deep shielding region to the first and second well regions and has a higher second conductivity type dopant concentrations than do the first and second well regions.

* * * * *

UNITED STATES PATENT AND TRADEMARK OFFICE
CERTIFICATE OF CORRECTION

| | | |
|---|---|---|
| PATENT NO. | : 11,610,991 B2 | Page 1 of 1 |
| APPLICATION NO. | : 17/082647 | |
| DATED | : March 21, 2023 | |
| INVENTOR(S) | : Islam et al. | |

It is certified that error appears in the above-identified patent and that said Letters Patent is hereby corrected as shown below:

In the Claims

Column 27, Line 34, Claim 10: delete "second sidewalk," and insert --second sidewall,--

Signed and Sealed this
Twentieth Day of June, 2023

*Katherine Kelly Vidal*

Katherine Kelly Vidal
*Director of the United States Patent and Trademark Office*